United States Patent
Sakurai

[11] Patent Number: 5,973,990
[45] Date of Patent: Oct. 26, 1999

[54] SYNCHRONOUS SEMICONDUCTOR MEMORY DEVICE INCLUDING A CIRCUIT FOR ARBITRARILY CONTROLLING ACTIVATION/INACTIVATION TIMING OF WORD LINE

[75] Inventor: Mikio Sakurai, Hyogo, Japan

[73] Assignee: Mitsubishi Denki Kabushiki Kaisha, Tokyo, Japan

[21] Appl. No.: 09/060,311

[22] Filed: Apr. 15, 1998

[30] Foreign Application Priority Data

Nov. 13, 1997 [JP] Japan ................................. 9-312355

[51] Int. Cl.⁶ ............................................. G11C 8/00
[52] U.S. Cl. .................. 365/233; 365/194; 365/230.03; 365/230.06
[58] Field of Search .................................. 365/194, 201, 365/230.03, 230.06, 233

[56] References Cited

U.S. PATENT DOCUMENTS

| | | | |
|---|---|---|---|
| 5,576,999 | 11/1996 | Kim et al. ............................... | 365/201 |
| 5,621,690 | 4/1997 | Jungroth .............................. | 365/230.03 |
| 5,708,612 | 1/1998 | Abe ..................................... | 365/230.03 |
| 5,734,604 | 3/1998 | Akamatsu et al. ....................... | 365/233 |
| 5,808,948 | 9/1998 | Kim et al. ............................... | 365/201 |
| 5,848,021 | 12/1998 | Sugibayashi ............................. | 365/201 |

FOREIGN PATENT DOCUMENTS 9-171700  6/1997  Japan .

*Primary Examiner*—David Nelms
*Assistant Examiner*—Gene N. Auduong
*Attorney, Agent, or Firm*—McDermott, Will & Emery

[57] ABSTRACT

An act signal generation circuit in a synchronous semiconductor memory device includes an act command latch circuit, an act command output circuit, and an act command control circuit. The act command latch circuit latches externally applied active command information. The act command output circuit responds to an enable signal to output an act initiation signal that renders a bank active. The act command control circuit responds to level transition of an external control signal in a test mode to alter the level of the enable signal. As a result, the active command information can be delayed and then transmitted to a bank.

15 Claims, 32 Drawing Sheets

US 5,973,990

SYNCHRONOUS SEMICONDUCTOR MEMORY DEVICE INCLUDING A CIRCUIT FOR ARBITRARILY CONTROLLING ACTIVATION/INACTIVATION TIMING OF WORD LINE

BACKGROUND OF THE INVENTION

1. Field of the Invention

The present invention relates to synchronous semiconductor memory devices responsive to an external clock signal for operation, and more particularly to a structure for realizing high speed performance testing.

2. Description of the Background Art

A synchronous semiconductor memory device developed for the purpose of high speed access has the operation (command) required for data reading and writing carried out in synchronization with an externally applied clock (external clock signal) of a stable cycle.

A conventional synchronous semiconductor memory device will be described hereinafter with reference to FIG. 31.

Referring to FIG. 31, a conventional synchronous semiconductor memory device 9000 includes a control signal buffer 1, an internal clock generation circuit 2, an address buffer 3, a mode set specify circuit 4, a precharge signal generation circuit 12, an act signal generation circuit 13, and a plurality of banks (Banks B0, B1, B2 and B3 in FIG. 31).

Each of banks B0, B1, B2 and B3 includes a row related control circuit 6, a word driver 7, a memory cell array 9, a sense amplifier, and an IO gate. The sense amplifier and the IO gate are indicated as one block 8 in FIG. 31. Each bank can individually carry out activation of a word line, data reading, data writing, and inactivation of a word line.

Memory cell array 9 includes a plurality of memory cells M arranged in a matrix. Each memory cell M is connected at a crossing of a word line WL provided corresponding to a row direction and a bit line pair BL and /BL provided corresponding to a column direction. Internal clock generation circuit 2 receives an external clock signal CLK to output an internal clock signal CLK0 to control the internal operation.

Control signal buffer 1 includes a first input stage 16 and a buffer 17. First input stage 16 receives an external control signal (external row address strobe signal /RAS, external column address strobe signal /CAS, external write enable signal /WE, external chip select signal /CS, and the like). Buffer 17 receives an output of input stage 16 to output an internal control signal (RAS, CAS, WE, CS, and the like) in synchronization with internal clock signal CLK0.

Address buffer 3 receives an externally applied address signal A to output an internal address signal. Address signal A is applied having a row address signal X and a column address signal Y multiplexed in a time-divisional manner. Address buffer 3 further includes a bank address decoder not shown for decoding address signal A to output a bank decode signal BK (or an inverted version ZBK) specifying a corresponding bank.

Act signal generation circuit 13 responds to an externally applied act command to output an act initiation signal ZACT (in FIG. 31, ZACT(0), ZACT(1), ZACT(2), ZACT(3)) for controlling a row related control circuit 6 of a specified bank.

Precharge signal generation circuit 12 responds to an externally applied precharge command to output a precharge initiation signal ZPRE (in FIG. 31, ZPRE(0), ZPRE(1), ZPRE(2), ZPRE(3)) for a controlling row related control circuit 6 of a specified bank.

Upon receiving a corresponding act initiation signal ZACT, each row related control circuit 6 outputs a precharge signal for precharging a corresponding bit line in an inactive state, a word driver activation signal for activating word driver 7 in an active state, and a sense amplifier activation signal for activating the sense amplifier at an active state.

As a result, the pair of bit lines BL and /BL forming memory cell array 9 is released from the precharged state, and word line WL is driven to an H level (logical high). Then, the data stored in memory cell M is amplified by the sense amplifier.

Each row related control circuit 6 also responds to a corresponding precharge initiation signal ZPRE to output a word driver activation signal in an inactive state, a sense amplifier activation signal in an inactive state, and a bit line precharge signal in an activation state. As a result, the potential of word line WL in memory cell array 9 is pulled down to an L level (logical L), and bit lines BL and /BL are precharged to the level of a precharge potential Vb1.

When an externally applied read command is input, the data latched at the sense amplifier is transmitted to the IO gate, and then amplified to be output through a data input/output terminal.

When an external write command is input, the data applied through the data input/output terminal is written into a relevant memory cell M via the IO gate and the sense amplifier.

Mode set specify circuit 4 functions to detect whether a particular mode is set in response to an external signal. Mode set specify circuit 4 responds to a signal from control signal buffer 1 and address buffer 3 (for example, a mode register set command + address signal ADD7 of an H level) to output a test mode signal. There is also a method of setting a test mode signal by direct control of an external test mode PAD.

An operation of conventional synchronous semiconductor memory device 9000 will be described with reference to the timing charts of FIGS. 32A–32F.

FIGS. 32A, B, C, D, E and F show an external clock signal CLK, an external control signal ICS, an external control signal /RAS, an external control signal /CAS, an external control signal /WE, and an address signal A, respectively. Here, chip select signal /CS is a control signal for selecting a chip to be operated out of a plurality of chips. In the following command input operation, a chip select signal ICS attains an active state of an L level.

The operation of activating a word line by an active command will be described first. In this case, an act command ACT is input (external control signals /CS and /RAS are set at an L level, and external control signals /CAS and /WE are set at an H level).

At time t1 when external clock signal CLK rises, these external control signals and row address signal X are received. Then, a word line of a corresponding bank is activated according to act initiation signal ZACT output from act signal generation circuit 13, whereby the data in memory cell M is read out to the sense amplifier.

An operation of a readout command will be described hereinafter. In this case, a read command READ is input (external control signal ICS and /CAS are set at an L level, and external control signals /RAS and /WE are set at an H level.

At the next rise of external clock signal CLK (time t2), these external control signals and column address signal Y are input. As a result, the data readout to the sense amplifier is applied to an output buffer not shown via an I/O line to be provided outside.

The operation of rendering a word line inactive by a precharge command will be described hereinafter. In this case, a precharge command PRE is input (external control signals ICS and /RAS, and /WE are set at an L level, and external control signal ICAS is set at an H level).

At the rise of external clock signal CLK at time t3, these external signals and bank address signal BK are input. Then, a corresponding word line is rendered inactive according to precharge initiation signal ZPRE output from precharge signal generation circuit 12.

At the next rise of external clock signal CLK (time t4), input of act command ACT renders a corresponding word line active, whereby the data in memory cell M is readout to the sense amplifier.

The duration between the sense amplifier activation time t1 and read out time R2 becomes a parameter for identifying the performance of a memory cell (this period is referred to as "tRCD period" hereinafter). For example, in a memory cell of an extremely small capacity, the sensing time by the sense amplifier is longer than that of a memory cell of a normal capacity. A fault of a memory cell can be discovered at an early stage by altering the tRCD period.

The duration between word line inactivation time t3 and reactivation time t4 (this duration is referred to as "tRP period" hereinafter) becomes an important timing for identifying the effect of the equalize timing of a bit line. For example, when activation of a word line is initiated before a bit line is sufficiently equalized after the fall of a word line, there is a possibility that the stored information to be read out will be destroyed by activation of a new word line due to the previous data remaining in the bit line. In general, 20 ns must be ensured for the tRCD period and tRP period.

When testing the performance of a synchronous semiconductor memory device of the above-described structure, an external clock signal and a command are provided from a tester. When the threshold performance is to be tested under the most critical conditions, a command is input at the edge of a continuous external clock signal (clock signal supplied by tester) as shown in FIG. 32. Accordingly, the shortest tRCD and tRP periods are realized, so that the threshold performance can be tested by identifying the operation characteristics in this state.

The input timing of a command to conventional synchronous semiconductor memory device 9000 depends upon the frequency of the clock signal that is constantly provided from the tester. This means that the tRCD and tRP periods depend (upper limit approximately 200 ns) on the threshold performance (approximately 200 ns) of the tester when the tester can provide only a clock signal of a low speed. There was a problem that it is difficult to identify the threshold performance of a device that operates at high speed.

SUMMARY OF THE INVENTION

In view of the foregoing, an object of the present invention is to provide a synchronous semiconductor memory device that can carry out performance testing by controlling externally and arbitrarily activation and inactivation of a word line even in the case where a tester is used that can supply only a clock signal of low speed.

Another object of the present invention is to provide a synchronous semiconductor memory device that can carry out performance testing at high speed even in the case where a tester is used that can supply only a clock signal of low speed.

According to an aspect of the present invention, a synchronous semiconductor memory device includes a plurality of banks, each bank including a memory cell array with a plurality of memory cells arranged in a matrix of rows and columns and a plurality of word lines provided corresponding to the rows of a memory cell array, an internal clock generation circuit for providing an internal clock signal in synchronization with an external clock signal, a test mode detection circuit responsive to an externally applied test mode specify signal for detecting specification of a particular test mode to output a test mode signal as the detected result, and an active control circuit for detecting an active command input in synchronization with an internal clock signal to activate a word line. The active control circuit responds to a test mode signal to delay an active initiation signal than an input timing of the active command and provide the active initiation signal to a corresponding bank.

Therefore, a main advantage of the present invention is that the active timing of a word line can be altered arbitrarily independent of an external clock signal by providing a circuit that can delay the activation timing of a word line.

Therefore, performance testing on a chip that carries out high speed operation can be implemented using a tester that supplies only a low speed clock signal.

Preferably, the synchronous semiconductor memory device further includes a circuit for latching active command information, and a circuit for controlling the timing of providing the latched active information to a bank in response to an external signal in a test mode.

Preferably, the synchronous semiconductor memory device includes a circuit for providing active command information and a circuit for delaying the output active command information in a test mode.

Preferably, the external signal per se is the active command information in a test mode.

Preferably, since delay of active command information is initiated at the fall of an internal clock signal, the number of delay stages can be reduced.

As a result, a word line active timing can be adjusted directly by external control in a test mode. In a normal mode, operation can be carried at the normal timing.

According to another aspect of the present invention, a synchronous semiconductor memory device includes a plurality of banks, each bank including a memory cell array with a plurality of memory cells arranged in a matrix of rows and columns and a plurality of word lines provided corresponding to the rows of the memory cell array, an internal clock generation circuit for providing an internal clock signal in synchronization with an external clock signal, a test mode detection circuit responsive to an externally applied test mode specify signal for detecting specification of a particular test mode to output a test mode signal as the detected result, and an inactivate control circuit for detecting an inactivate command input in synchronization with the internal clock signal to render said word line inactive and providing an inactive initiation signal for rendering said word line inactive. The inactive control circuit responds to a test mode signal for delaying an inactive initiation signal than the input timing of an inactive command and providing the delayed inactive initiation signal to a corresponding bank.

Therefore, a main advantage of the present invention is that the inactive timing of a word line can be altered arbitrarily independent of an external clock signal by providing a circuit that can delay the timing of inactivation of a word line.

Thus, performance testing of a chip that carries out high speed operation can be implemented even when a tester is used that can supply only a low speed clock signal.

Preferably, the synchronous semiconductor memory device includes a circuit for latching inactive command information, and a circuit for controlling the output timing of the latched inactive command information to a bank according to an external signal in a test mode.

Preferably, the synchronous semiconductor memory device includes a circuit for providing inactive command information, and a circuit for delaying this output inactive command information in the test mode.

Preferably, the external signal per se is the inactive command information in a test mode.

Preferably, since delay of inactive command information is initiated at the fall of an internal clock signal, the number of delay stages can be reduced.

Thus, the word line inactive timing can be adjusted more directly by external control in a test mode. In a normal mode, operation can be carried out at the normal timing.

According to a further aspect of the present invention, a synchronous semiconductor memory device includes a plurality of banks, each bank including a memory cell array having a plurality of memory cells arranged in a matrix of rows and columns and a plurality of word lines provided corresponding to the rows of the memory cell array, an internal clock generation circuit for providing an internal clock signal in synchronization with an external clock signal, a test mode detection circuit responsive to an externally applied test mode specify signal for detecting specification of a particular test mode to output a test mode signal as a detected result, an active control circuit for detecting an active command of rendering a word line active and that is applied in synchronization with the internal clock signal to output an active initiation signal that renders a word line active, and an inactive control circuit for detecting an inactive command applied in synchronization with an internal clock signal for rendering a word line inactive to output an inactive initiation signal that renders a word line inactive. The active control circuit responds to a test mode signal to delay the active initiation signal than an input timing of an active command and providing the delayed active initiation signal to a corresponding bank. The inactive control circuit responds to a test mode signal for delaying an inactive initiation signal than an input timing of an inactive command and providing the delayed inactive initiation signal to a corresponding bank.

A main advantage of the present invention is that the active/inactive timing of a word line can be altered arbitrarily independent of an external clock signal by providing a circuit that can delay the timing of rendering a word line active/inactive.

Therefore, performance testing of a chip that is operated at high speed can be implemented even when a tester is used that can supply only a low speed clock signal.

Preferably, control can be provided of the latch of active command information and inactive command information, and the timing of providing the active command information and the inactive command information in response to an external signal in a test mode.

Preferably, the synchronous semiconductor memory device includes a circuit for delaying the active command information and the inactive command information in a test mode for output.

Preferably, the external signal per se is the active command information and inactive command information in a test mode.

Since delay of active command information and inactive command information can be initiated at the time of the fall of an internal clock signal, the number of delay stages can be reduced.

Thus, the word line active and inactive timing can be adjusted more directly by external control in a test mode. In a normal mode, operation can be carried out at the normal timing.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
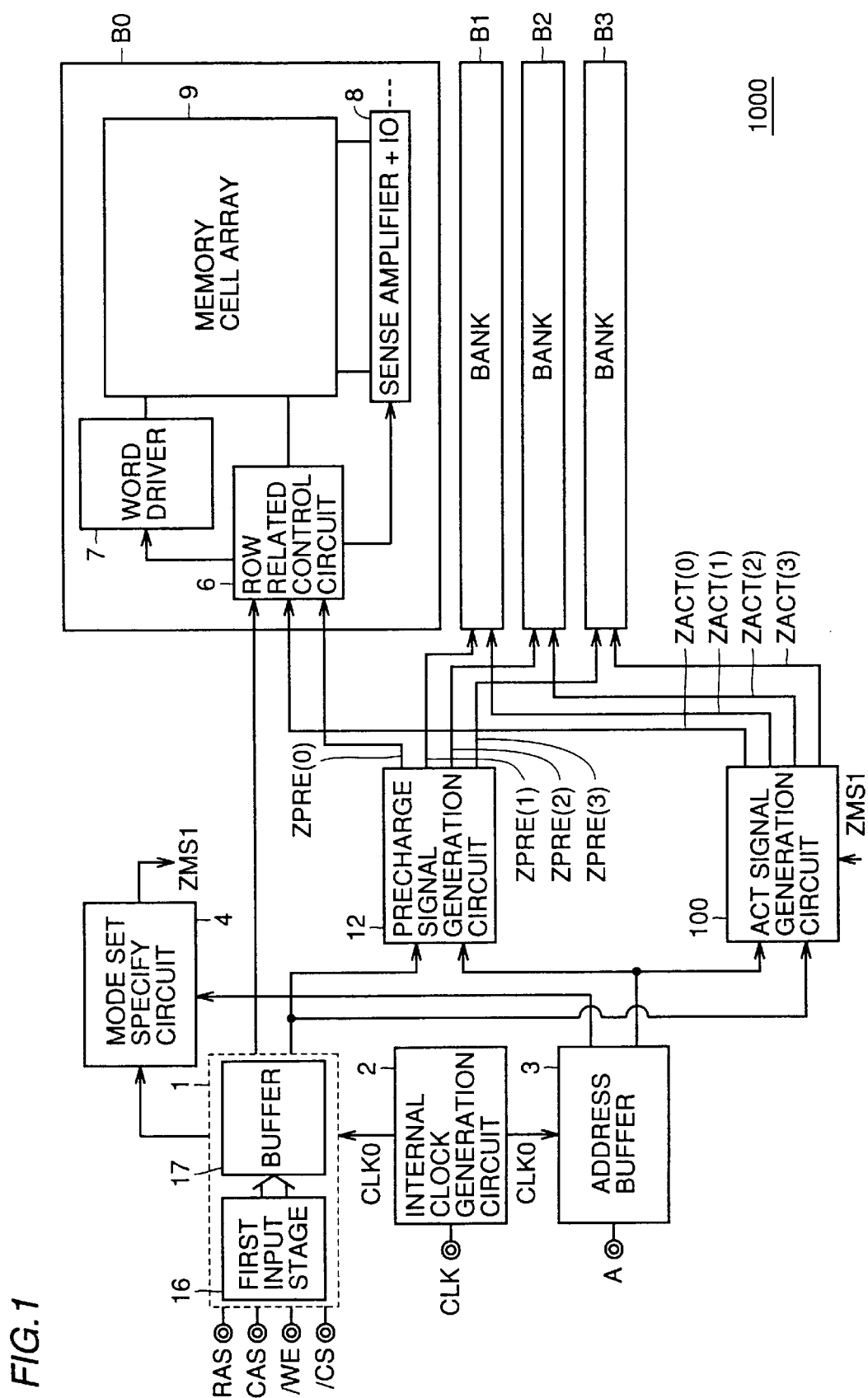
FIG. 1 is a schematic block diagram showing an example of an entire structure of a synchronous semiconductor memory device 1000 according to a first embodiment of the present invention.

A synchronous semiconductor memory device according to a first embodiment of the present invention allows arbitrary control of the timing of bank activation in a test mode.

The entire structure of a synchronous semiconductor memory device 1000 according to a first embodiment of the present invention will be described with reference to FIG. 1.

The same reference characters are allotted for elements similar to those of conventional synchronous semiconductor memory device 9000. Description already provided for synchronous semiconductor memory device 9000 will not be repeated here.

Synchronous semiconductor memory device 1000 of FIG. 1 differs from conventional semiconductor memory device 9000 in that an act signal generation circuit 100 that can delay and output an act initiation signal ZACT is substituted for act signal generation circuit 13.

Act signal generation circuit 100 latches active command information according to an externally applied act command ACT. In a test mode, the timing of transmitting the latched active command information to a bank is adjusted according to a particular external signal. In a mode other than the test mode (normal mode), the active command information is transmitted to a bank in response to act command ACT as in a conventional case.

As a result, synchronous semiconductor memory device 1000 can activate a bank at a timing more delayed than the active timing of conventional synchronous semiconductor memory device 9000.

Mode set specify circuit 4 generates a test mode signal ZMS1 as a result of detecting a particular test mode in the first embodiment.

A specific structure of act signal generation circuit 100 of the first embodiment will be described with reference to FIG. 2. The act signal generation circuit of FIG. 2 (referred to as act signal generation circuit 100.1 hereinafter) includes a NAND circuit 22, act command latch circuits 24.0. 24.1, 24.2, and 24.3, an act command output circuit 26 and an act command control circuit 28.1.

NAND circuit 22 detects that an externally applied act command ACT is input according to an internal control signal output from buffer 17 shown in FIG. 1. As a result of the detection, act command signal ZACTF is output. Act command latch circuits 24.0, 24.1, 24.2, 24.3 (generically referred to as act command latch circuit 24 hereinafter) are provided corresponding to banks B0, B1, B2, and B3, respectively. Act command latch circuit 24 retains active command information of a corresponding bank.

Act command output circuit 26 responds to act enable signal ACTEN that will be described afterwards to output act initiation signal ZACT according to the retained active command information. Act command control circuit 28.1 responds to test mode signal ZMS1 and a particular external signal (specifically, external control signal /RAS) to output act enable signal ACTEN that enables the output operation of act command output circuit 26.

NAND circuit 22 receives internal control signals CS, RAS, ZCAS and ZWE at its input. Here, internal control signal CS is an internal signal of an opposite phase corresponding to external control signal /CS. Internal control signal RAS is an internal signal of an opposite phase corresponding to external control signal /RAS. Internal control signal ZCAS is an internal signal of the same phase corresponding to external control signal /CAS. Internal signal ZWE is an internal signal of the same phase corresponding to external control signal /WE.

Upon input of act command ACT (internal control signals CS, RAS, ZCAS and ZWE all at an H level), an act command signal ZACTF at an L level of an active state is output from NAND circuit 22. Otherwise (act command ACT not input), an act command signal ZACTF at an H level of an inactive state is output from NAND circuit 22.

The structure of act command latch circuit 24 will be described hereinafter taking an act command latch circuit 24.0 corresponding to bank B0 as an example. Act command latch circuit 24.0 includes logic gates 32 and 33, and a NAND circuit 34.

The first input node of logic gate 32 receives act command signal ZACTF from NAND circuit 22. The second input node of logic gate 32 receives a corresponding bank decode signal ZBK(0) from address buffer 3 shown in FIG. 1. Logic gate 33 receives an output signal of logic gate 32 at its first input node and the output signal of NAND circuit 34 at its second input node. NAND circuit 34 receives an output signal of logic gate 33 at its first input node and a corresponding precharge initiation signal ZPRE(0) from precharge signal generation circuit 12 of FIG. 1 at its second input node.

Act command latch circuits 24.1, 24.2 and 24.3 respectively have a structure identical to that of act command latch circuit 24.0. The output signals of respective logic gates 33 of act command latch circuit 24 is indicated as ACTF(0), ACTF(1), ACTF(2), ACTF(3) (generically indicated as ACTF).

The operation of act command latch circuit 24 will be briefly described hereinafter taking act command latch circuit 24.0 as an example. When act command ACT is input specifying bank B0, act command signal ZACTF is driven to an L level of an active state, and bank decode signal ZBK(0) is driven to an L level of an active state. In response, signal ACTF(0) corresponding to bank B0 attains an active state of an H level. Signal ACTF(0) maintains the active state of the H level thereafter regardless of the potential level of act command signal ZACTF and bank decode signal ZBK(0).

When an act command ACT is input specifying a bank other than bank B0 (act command signal ZACTF at an L level, and bank decode signal ZBK(0) at an H level), signal ACTF(0) corresponding to bank B(0) is maintained at the previous state. In the case other than act command ACT, signal ACTF(0) maintains the previous state.

Precharge initiation signal ZPRE is used to reset the latched active command information. More specifically, when precharge initiation signal ZPRE(0) corresponding to bank B0 attains an active state of an L level, signal ACTF(0) is driven to an inactive state (reset state) of an L level.

The structure of act command output circuit 26 will be described hereinafter. Act command output circuit 26 includes NAND circuits 42.0, 42.1, 42.2 and 42.3 (generically referred to as NAND circuit 42 hereinafter). NAND circuits 42 are provided corresponding to banks B0, . . . , B3, respectively.

Each first input node of NAND circuit 42 receives signal ACTF held in a corresponding act command latch circuit 24. Each second input node of NAND circuit 42 receives act enable signal ACTEN output from act command control circuit 28. Respective NAND circuits 42 output act initiation signal ZACT for initiating activation of a corresponding bank.

The operation of act command output circuit 26 will be described briefly hereinafter. When act enable signal ACTEN is at an inactive state of an L level (test mode), each act initiation signal ZACT attains an inactive state of an H level. When act enable signal ACTEN is at an active state of an H level (normal mode, test mode), act initiation signal ZACT of an H level or an L level is output according to the latched active command information.

Act command control circuit 28.1 includes logic gates 35 and 36, an NOR circuit 37, a NAND circuit 38, and an inverter circuit 39.

Logic gate 35 receives act command signal ZACTF at its first input node and a test mode signal ZMS1 from test mode specify circuit 4 of FIG. 1 at its second input mode. Logic gate 36 receives an output signal of logic gate 35 at its first input node and an output signal of NAND circuit 38 at its second input node. NOR circuit 37 receives a test mode signal ZMS1 at its first input node and a signal ZBRAS at its second input node. Here, signal ZBRAS is an internal signal of the same phase corresponding to external control signal /RAS to be output from first input stage 16 of FIG. 1.

NAND circuit 38 receives an output signal S1 of logic gate 36 at its first input node and an output signal of NOR circuit 37 at its second input node. Logic gates 35 and 36, NOR circuit 37 and NAND circuit 38 form a latch circuit 40. In a test mode (test mode signal ZMS1 at an active state of an L level), latch circuit 40 sets the internal state according to signal ZACTF to output signal S1 of an H level when signal ZPRAS attains an L level, and outputs a signal S1 of an L level when signal ZBRAS is driven to an H level. In the normal mode, signal S1 is at an L level.

Inverter circuit 39 has its input node connected to the output node of logic gate 36. Inverter circuit 39 inverts signal Sl to output act enable signal ACTEN. Therefore, act enable signal ACTEN is fixed at an H level in a normal mode, and altered according to signal ZBRAS in a test mode.

The operation of act signal generation signal 100.1 in a test mode will be described hereinafter with reference to the timing charts of FIGS. 3A–3F.

Figure 3:
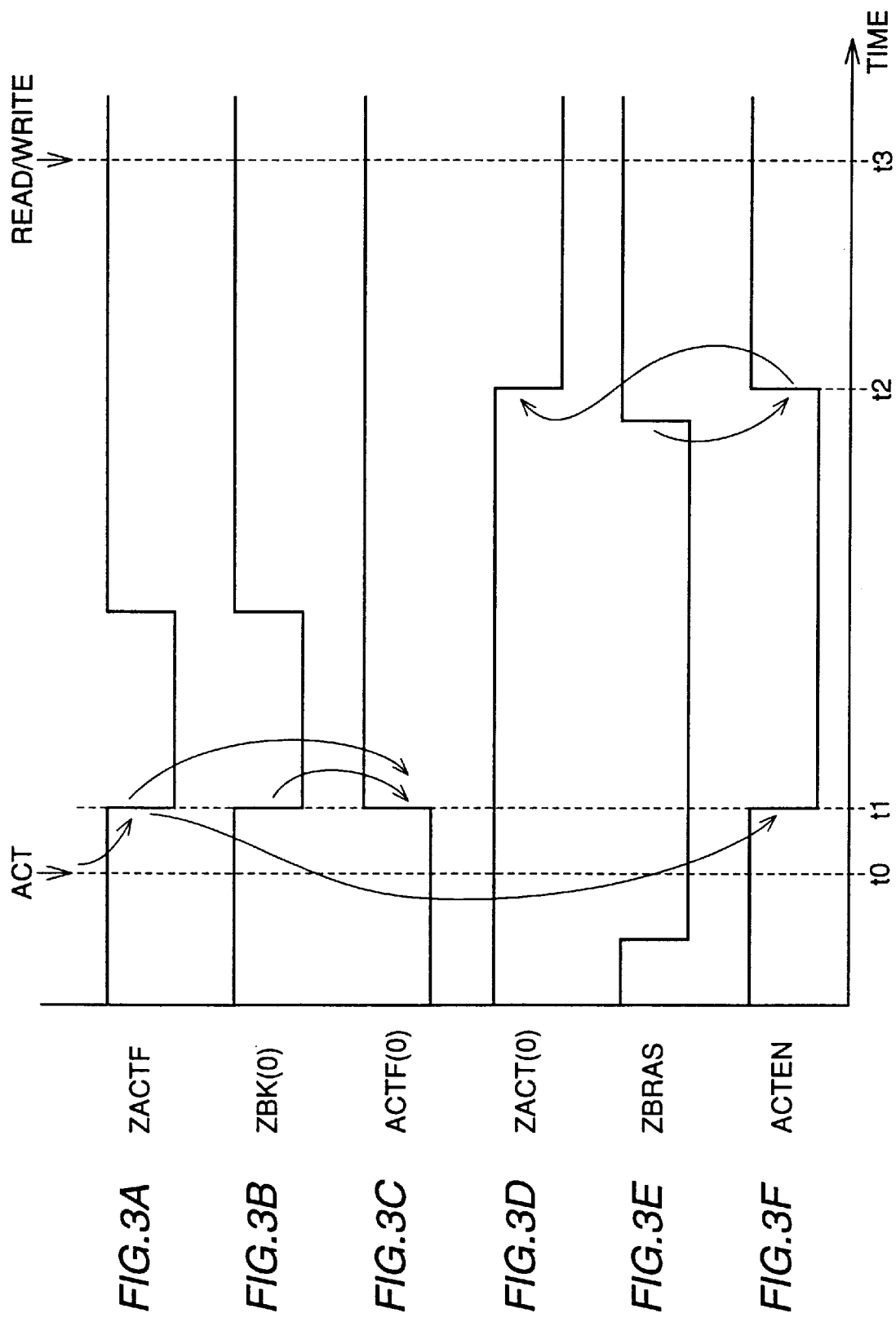
FIGS. 3A–3F are timing charts for describing an operation of an act signal generation circuit 100.1 of FIG. 2.

FIG. 3A shows act command signal ZACTF. FIG. 3B shows bank decode signal ZBK(0). FIG. 3C shows signal ACTF(0). Signal 3D shows act initiation signal ZACT(0). FIG. 3E shows signal ZBRAS. FIG. 3F shows act enable signal ACTEN. In a test mode, it is assumed that act command ACT corresponding to bank B0 is input from an external source.

When act command ACT is input at time t0 as shown in FIGS. 3A–3F, act command signal ZACTF is driven to an L level at time t1. In response to specification of bank B0 (bank decode signal ZBK(0) is at an active state of an L level), signal ACTF(0) attains an active state of an H level. It is to be noted that signal ZBRAS is at an L level.

When act command signal ZACTF is pulled to an L level, act enable signal ACTEN is driven to an inactive state of an L level. Therefore, the latched active command information is not transmitted to each bank.

In response to external control (external control signal /RAS driven to an H level from an L level), signal ZBRAS is set at an H level. In response, act enable signal ACTEN is driven to an active state of an H level at time t2.

As a result, act command output circuit 26 is enabled, whereby bank initiation signal ZACT(0) at an active state of an L level is output with respect to the specified bank B0. In response, activation of a word line of bank B0 is initiated (after the actual input time point of act command ACT).

When a read or write command (READ/WRITE) is input (time t3) at the next input timing of the external clock signal, the duration between time t2 and time t3 corresponds to the tRCD period.

More specifically, the provision of act signal generation circuit 100.1 in synchronous semiconductor memory device 1000 allows adjustment of the transmission of active command information to a bank, so that the bank activation timing can be sufficiently delayed from the actual input time point of act command ACT.

In a normal mode, act enable signal ACTEN is in an active state of an H level. Therefore, a corresponding bank initiation signal ZACT is output to respective banks according to the input timing of an externally applied act command ACT.

Figure 2:
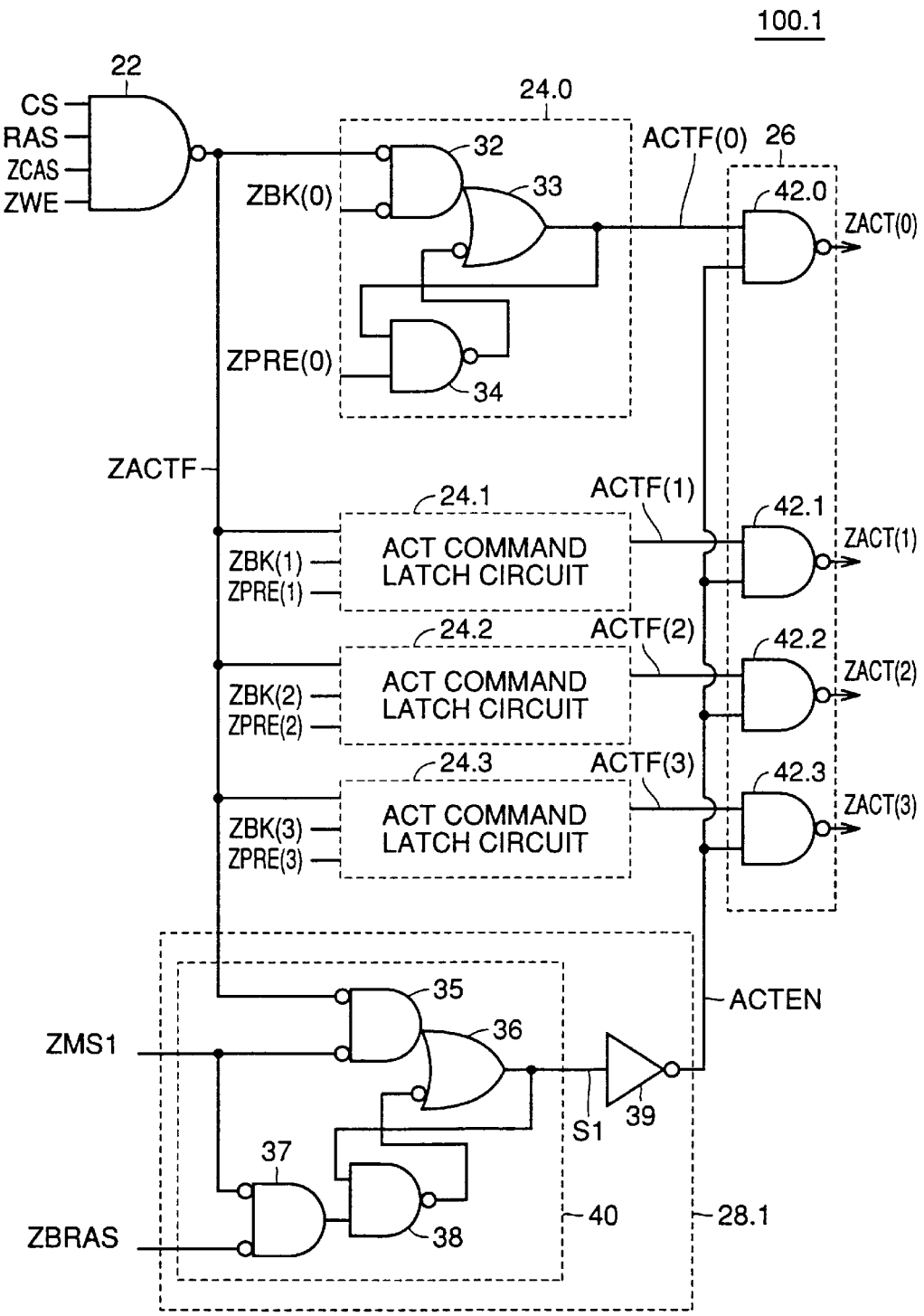
FIG. 2 is a circuit diagram showing an example of a specific structure of an act signal generation circuit 100 of the first embodiment.

In FIG. 2, transmission of act initiation signal ZACT to a corresponding row related control circuit is adjusted according to the level of external control signal /RAS. The present invention is not limited to this external control signal, and other external control signals such as /CAS, CKE, and DQM can be used.

Figure 4:
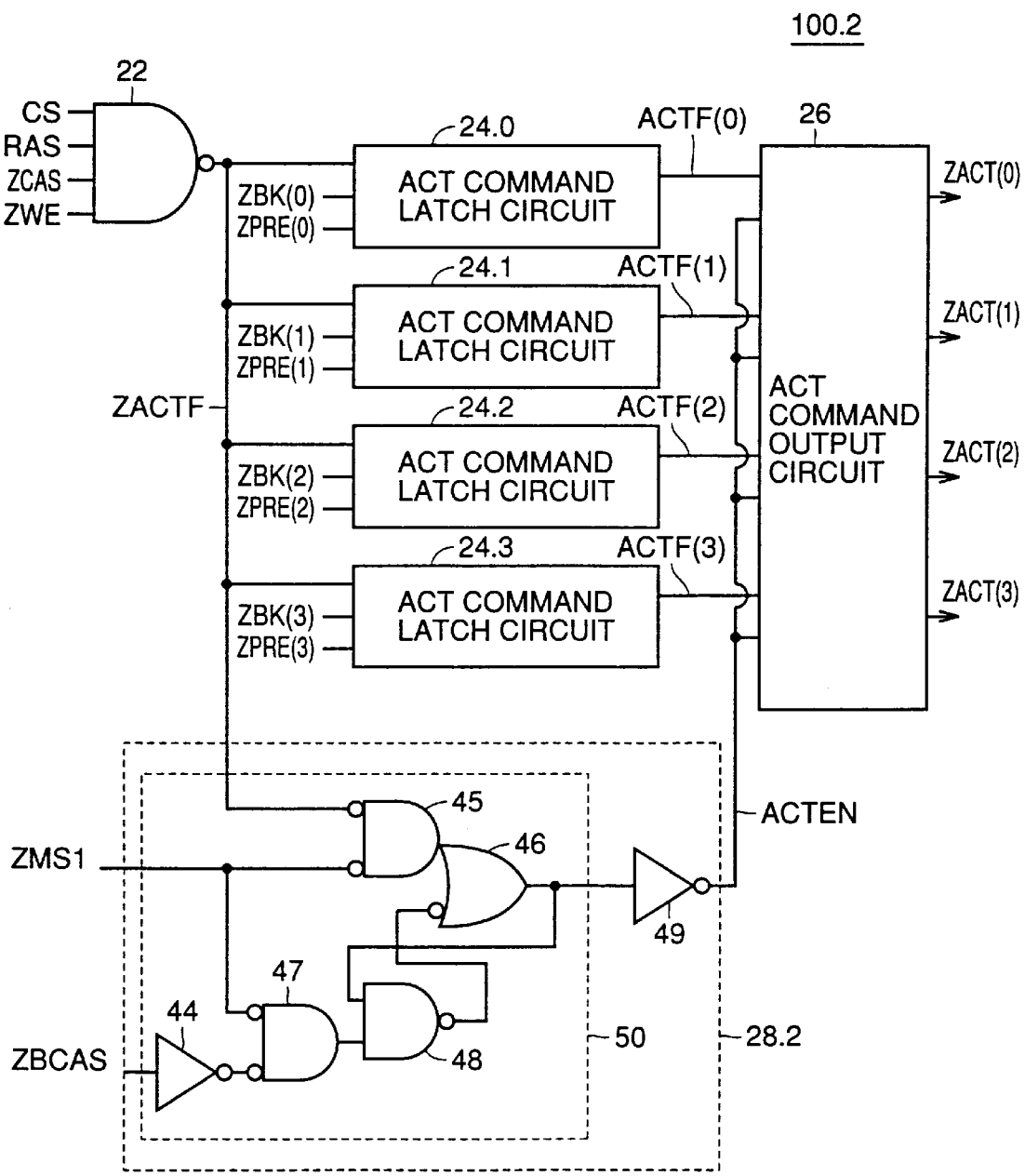
FIG. 4 is a circuit diagram showing an example of another specific structure of act signal generation circuit 100 of the first embodiment.
Figure 5:
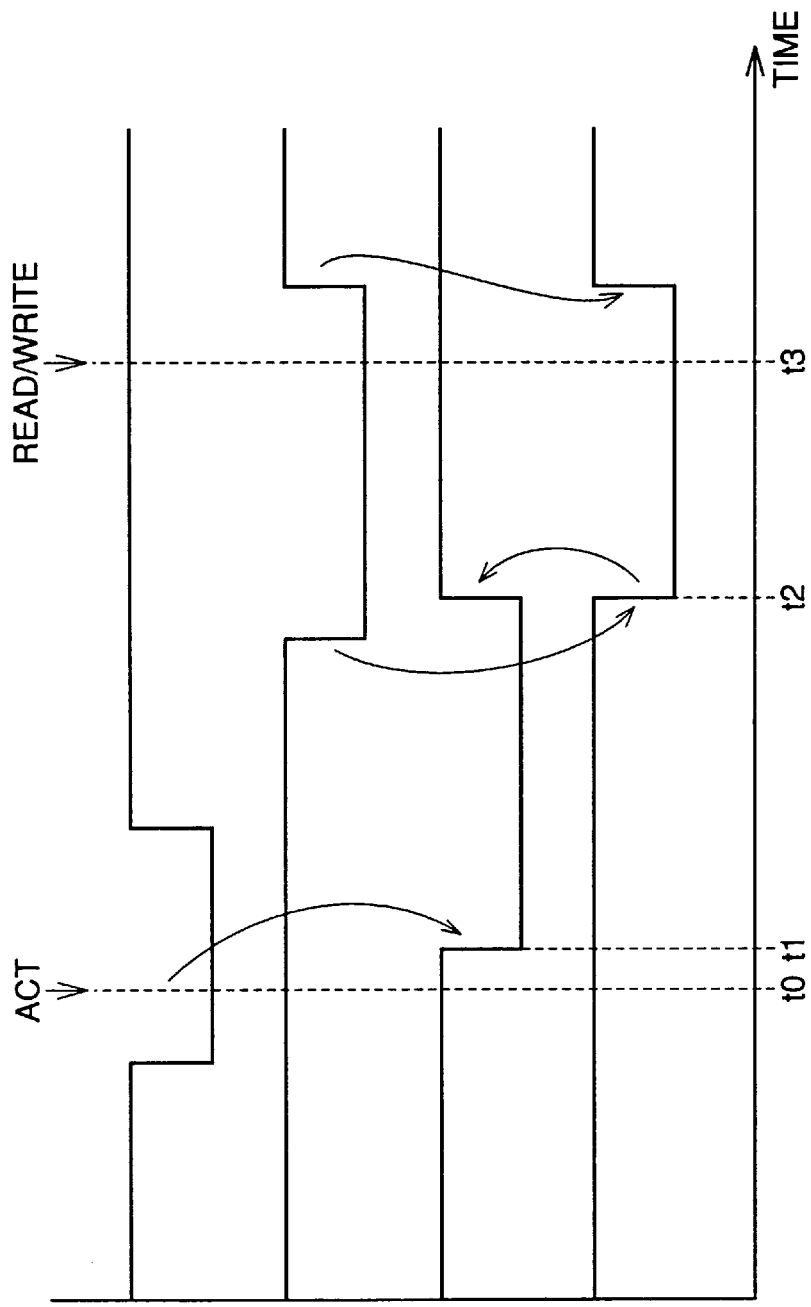
FIGS. 5A–5D are timing charts for describing an operation of an act signal generation circuit 100. 2 of FIG. 4.
Figure 6:
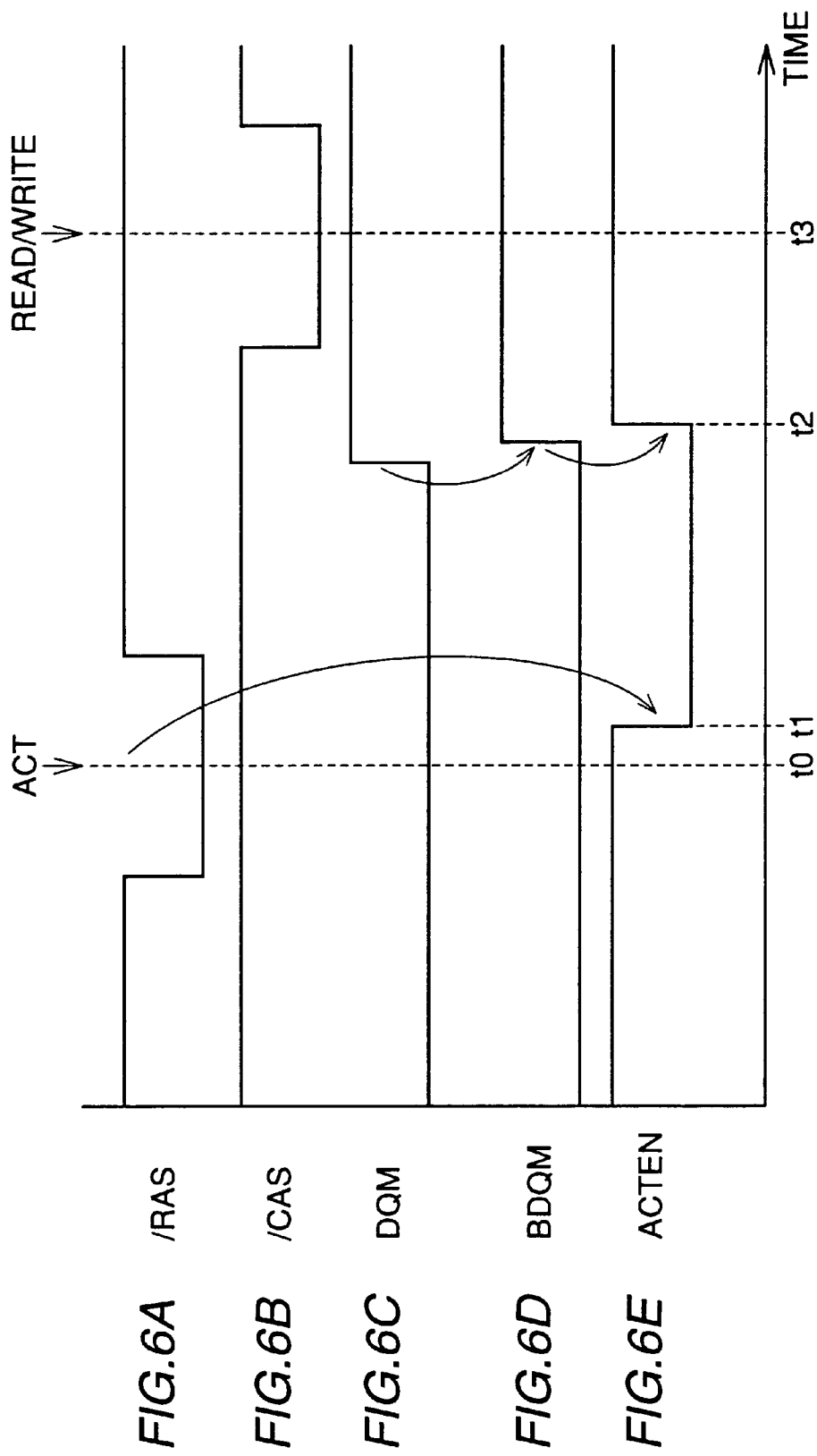
FIGS. 6A–6E are timing charts for describing an operation when the level of an act enable signal ACTEN is controlled by an external control signal DQM in the first embodiment.

An example of another specific structure of act signal generation circuit 100 of the first embodiment will be described hereinafter with reference to FIG. 4. In FIG. 4, elements corresponding to those of act signal generation circuit 100.1 of FIG. 2 have the same reference characters allotted, and their description will not be repeated.

The act signal generation circuit of FIG. 4 (referred to as act signal generation circuit 100.2 hereinafter) includes an act command control circuit 28.2 instead of act command control circuit 28.1.

Act command control circuit 28.2 includes logic gates 45 and 46, a NOR circuit 47, a NAND circuit 48, and inventer circuits 44 and 49. Logic gates 45 and 46, NOR circuit 47, NAND circuit 48, and inverter circuit 44 form a latch circuit 50. Logic gate 45 receives act command signal ZACTF at its first input node and a test mode signal ZMS1 at its second input node. Logic gate 46 receives an output signal of logic gate 45 at its first input node, and an output signal of NAND circuit 48 at its second input node.

Inverter circuit 44 receives signal ZBCAS from first input stage 16 of FIG. 1 at its input node to output an inverted version thereof. Here, signal ZBCAS is an internal signal of the same phase corresponding to external control signal /CAS.

NOR circuit 47 receives test mode signal ZMS1 at its first input node and an output signal of inverter circuit 44 at its second input node. NAND circuit 48 receives an output signal of logic gate 46 at its first input node, and an output signal of NOR circuit 47 at its second input node. Inverter circuit 49 inverts the output signal of logic gate 46 to output act enable signal ACTEN.

Act signal generation circuit 100.2 adjusts the timing of transmitting active command information to a bank according to transition of external control signal /CAS in the test mode (test mode signal ZMS1 at an active state of an L level). In the normal mode, the active timing is determined in response to act command ACT as in the conventional case.

The operation of act signal generation circuit 100.2 in a test mode will be described hereinafter with reference to the timing charts of FIGS. 5A–5D.

FIGS. 5A, 5B, 5C and 5D correspond to external control signal /RAS, external control signal /CAS, act enable signal ACTEN, and signal ZBCAS, respectively. Here, it is assumed that act command ACT corresponding to bank B0 is input in the test mode.

Since external control signal /CAS is at an H level at the time point (time t0) when act command ACT is input as shown in FIGS. 5A–5D, act enable signal ACTEN attains an inactive state of an L level at time t1. Therefore, the latched active command information is not transmitted to each bank.

Then, in response to external control (external control signal /CAS driven to an L level from an H level), signal ZBCAS is set to an L level. In response, act enable signal ACTEN is driven to an active state of an H level at time t2.

As a result, act command output circuit 26 is enabled, so that bank initiation signal ZACT(0) at an active state of an L level is output to the specified bank B0. In response, activation of bank B0 is initiated (delayed than the actual input time point of act command ACT).

When a read or write command (READ/WRITE) is input (time t3) at the next input timing of the external signal, the duration between time t2 and time t3 corresponds to the tRCD period.

More specifically, the provision of act signal generation circuit 100.2 in synchronous semiconductor memory device 100 allows adjustment of the transmission of active command information to a bank, so that the active timing of the bank can be delayed sufficiently than the actual input time point of act command ACT.

When in a normal mode, act enable signal ACTEN is in an active state of an H level. Therefore, a corresponding bank initiation signal ZACT is output with respect to respective banks according to the input timing of an externally applied act command ACT.

A structure can be provided by resetting latch circuit 50 by generating a one shot pulse by signal ZBCAS instead of inverter circuit 44 and the logic gate in act command control circuit 28.2.

The level of act enable signal ACTEN can be controlled by an external control signal DCM that is a control signal for suppressing data output (readout mask signal).

FIGS. 6A–6E are timing charts for describing an operation when the level of act enable signal ACTEN is controlled by external control signal DQM. FIGS. 6A, 6B, 6C, 6D, and 6E correspond to external control signal /RAS, external control signal /CAS, external control signal DQM, signal BDQM, and act enable signal ACTEN, respectively. Signal BDQM is output from first input stage 16 of FIG. 1, and is an internal signal of the same phase corresponding to external control signal DQM. Here, it is assumed that test mode signal ZMS1 is in an active state of an L level (test mode).

In response to external control signal DQM pulled up to an H level (transition of signal BDQM to an H level), act enable signal ACTEN is driven to an H level from an L level.

As a result, act enable signal ACTEN is driven to an inactive state of an L level (time t1) since external control signal DQM is at an L level (L level of signal BDQM) when act command ACT is input (time t0) as shown in FIGS. 6A–6E. Therefore, the latched active command information is not yet transmitted to each bank at time t1.

Then, in response to external control (rise of external control signal DQM to an H level), signal BDQM is set at an H level. In response, act enable signal ACTEN attains an active state of an H level at time t2. As a result, activation of bank B0 is initiated lagging the actual input time point of act command ACT.

When a read or write command (READ/WRITE) is input (time t3) at the next input timing of the external signal, the duration between time t2 and time t3 corresponds to the tRCD period.

In this case, the internal control signal corresponding to external control signal DQM is internally fixed at an L level to prevent read (write) masking.

An example of another specific structure of act signal generation circuit 100 of the first embodiment will be described with reference to FIG. 7.

Figure 7:
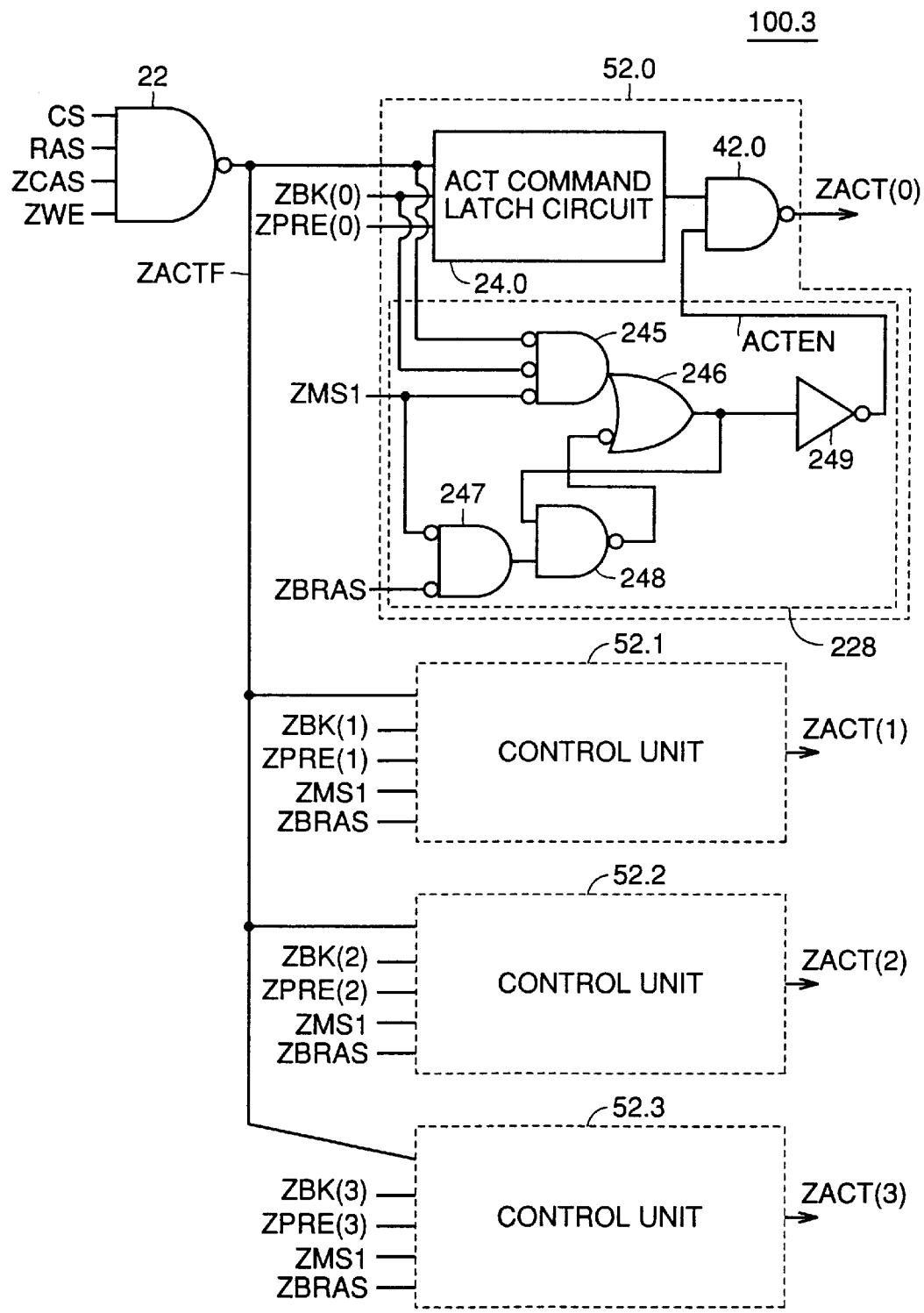
FIG. 7 is a circuit diagram showing an example of a further specific structure of act signal generation signal 100 of the first embodiment.

In FIG. 7, elements corresponding to those of act signal generation circuit 100.1 of FIG. 2 have similar reference characters allotted, and their description will not be repeated.

The act signal generation circuit of FIG. 7 (referred to as act signal generation circuit 100.3 hereinafter) includes control units 52.0, 52.1, 52.2, and 52.3. Control units 52.0, 52.1, 52.2, and 52.3 (generically referred to as control unit 52 hereinafter) are provided corresponding to banks B0, ..., B3, respectively.

Each control unit 52 includes a corresponding act command latch circuit 24, a NAND circuit 42 forming a corresponding act command output circuit 26, and an act command control circuit 228.

Act command control circuit 228 includes logic gates 245 and 246, an NOR circuit 247, a NAND circuit 248, and an inverter circuit 249.

Act command control circuit 228 has a structure similar to that of act command control circuit 28.1 shown in FIG. 2, provided that logic gate 245 in contrast to logic gate 35 of FIG. 2 receives act command signal ZACTF at its first input node, bank decode signal ZBK at its second input node, and test mode signal ZMS1 at its third input node. Accordingly, act command control circuit 228 responds to a corresponding bank decode signal to control the potential level of act enable signal ACTEN according to an external signal.

More specifically, act signal generation circuit 100.3 includes a circuit for latching an active command (act command latch circuit 24), and a control circuit for controlling the transmission of active command information (act command control circuit 228) corresponding to respective banks. This structure provides the advantage that the tRCD period of a different bank can be controlled independently in a state where a certain bank is active.

The synchronous semiconductor memory device of the first embodiment of the present invention allows a bank to be rendered active lagging the actual input time point of act command ACT. As a result, the tRCD period becomes shorter than the conventional tRCD period. Therefore, testing can be implemented on a memory that carries out high speed operation using a tester that can supply only a low speed clock signal.

Second Embodiment

A synchronous semiconductor memory device 2000 according to a second embodiment of the present invention allows arbitrary control of the inactivation timing of a bank in a test mode.

Figure 8:
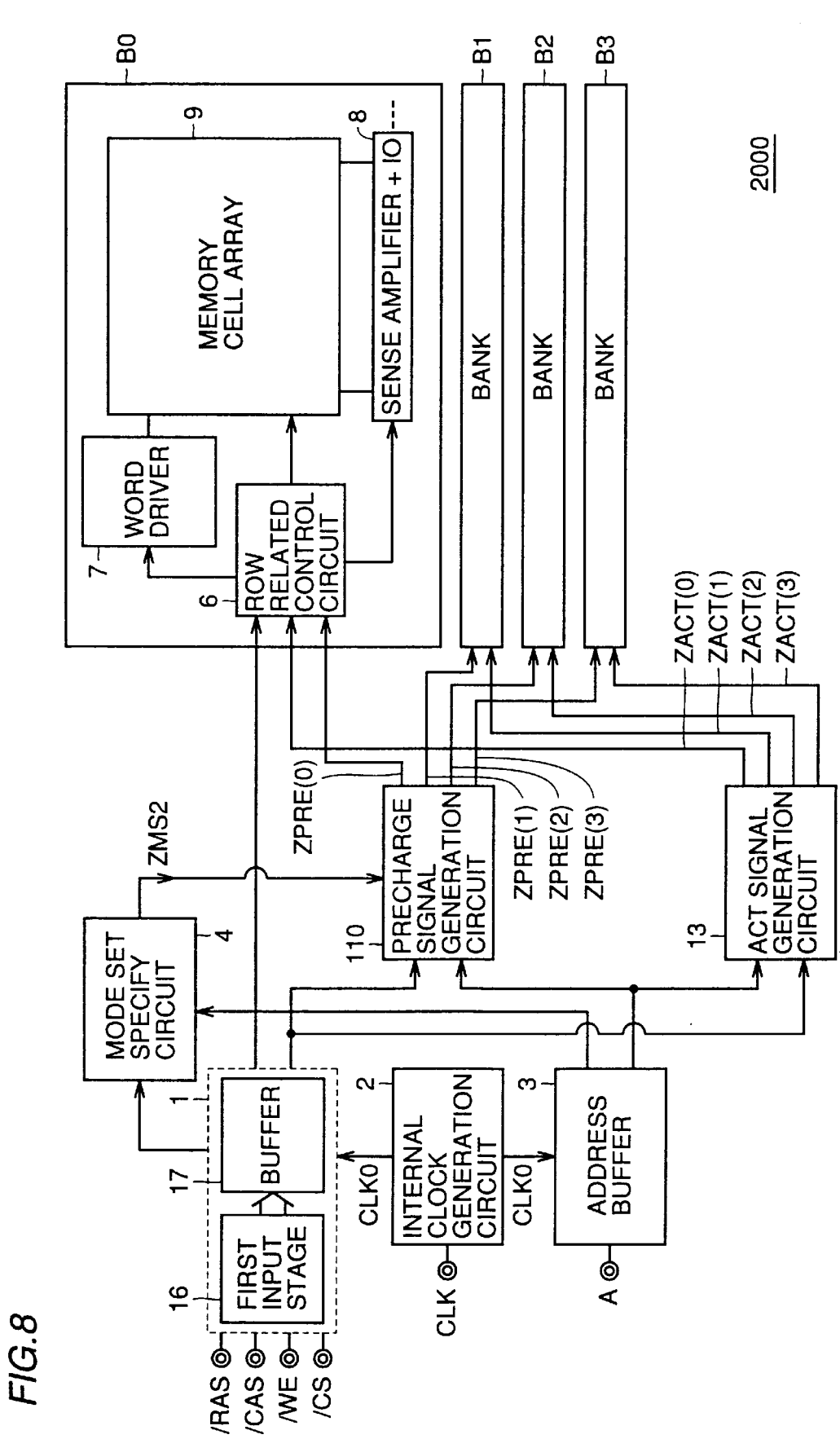
FIG. 8 is a schematic block diagram showing an example of an entire structure of a synchronous semiconductor memory device 2000 according to a second embodiment of the present invention.

Synchronous semiconductor memory device 2000 according to the second embodiment of the present invention will be described hereinafter with reference to FIG. 8. In FIG. 8, elements corresponding to those of the conventional synchronous semiconductor memory device 9000 have the same reference characters allotted, and their description will not be repeated.

Synchronous semiconductor memory device 2000 of FIG. 8 differs from conventional synchronous semiconductor memory device 9000 in that a precharge signal generation circuit 110 that can delay and output a precharge initiation signal is provided instead of precharge signal generation circuit 12.

Precharge signal generation circuit 110 adjusts the timing of the transmission of precharge command information to a bank according to a particular external signal in a test mode. In a mode other than the test mode (normal mode), precharge command information is transmitted to a bank in response to a precharge command as in the conventional case.

Synchronous semiconductor memory device 2000 can render a bank inactive at a timing lagging behind the inactivation timing of conventional synchronous semiconductor memory device 9000 in a test mode.

Mode set specify circuit 4 outputs a test mode signal ZMS2 as a result of detecting a particular test mode in the second embodiment of the present invention.

An example of a specific structure of precharge signal generation circuit 110 of the second embodiment will be described with reference to FIG. 9.

The precharge signal generation circuit shown in FIG. 9 (generically referred to as precharge signal generation circuit 110.1 hereinafter) includes a NAND circuit 54, an inverter circuit 56, a precharge command output circuit 60, and a precharge command control circuit 62.

NAND circuit 54 and inverter circuit 56 respond to an internal control signal output from buffer 17 of FIG. 8 to detect input of an external precharge command. Precharge command signal PRECF is output as a result of the detection. Precharge command output circuit 60 responds to precharge enable signal ZPEN that will be described afterwards to output a corresponding precharge initiation signal ZPRE according to precharge command information corresponding to respective banks.

Precharge command control circuit 62 responds to test mode signal ZMS2 and a particular external signal (specifically, external control signal /WE) to output precharge enable signal ZPEN that enables the operation of precharge command output circuit 60.

NAND circuit 54 and inverter circuit 56 will be described hereinafter.

NAND circuit 54 receives internal control signals CS, RAS, ZCAS, and WE at its input. Here, internal control signal WE is an internal signal of an opposite phase corresponding to external control signal /WE.

In response to input of precharge command PRE (internal control signals CS, RAS, ZCAS and WE all at an H level), a signal of an L level is output from NAND circuit 54, whereby precharge command signal PRECF in an active state of an H level is output from inverter circuit 56.

When precharge command PRE is not input, a signal of an H level is output from NAND circuit 54, whereby precharge command signal PRECF at an inactive state of an L level is output from inverter circuit 56.

Precharge command output circuit 60 will be described hereinafter.

Precharge command output circuit 60 includes NAND circuits 74.0, 74.1, 74.2 and 74.3 (generically referred to as NAND circuit 74 hereinafter). Respective NAND circuits 74 are provided corresponding to banks B0, ..., B3, respectively.

NAND circuit 74 receives precharge command signal PRECF at its first input node, a corresponding bank decode signal BK at its second input node, and a test mode signal ZMS2 at its third input node.

The output of all NAND circuits 74 is at an H level when in a test mode (test mode signal ZMS2 at an active state of an L level).

When in a normal mode (test mode signal ZMS2 at an inactive state of an H level), a signal of an L level is output from NAND circuit 74 corresponding to the specified bank. A signal of an H level is output from the remaining NAND circuits 74.

Precharge command output circuit 60 further includes logic gates 75.0, 75.1, 75.2 and 75.3, and inverter circuits 76.0, 76.1, 76.2 and 76.3 (generically referred to as logic gate 75 and inverter circuit 76, respectively, hereinafter). Logic gate 75 and inverter circuit 76 are provided corresponding to banks B0, . . . , B3, respectively.

Logic gate 75 receives an output signal of a corresponding NAND circuit 74 at its first input gate, and a precharge enable signal ZPEN output from precharge command control circuit 62 that will be described afterwards at its second input node. Inverter circuit 76 receives an output signal of a corresponding logic gate 75 to output a corresponding precharge initiation signal ZPRE.

The operation of precharge command output circuit 60 will be described briefly hereinafter.

When precharge enable signal ZPEN is in an inactive state of an H level (normal mode, test mode), the output of respective inverter circuits 76 shows a transition according to the output signal of a corresponding NAND circuit 74. In a test mode, the output signal of a corresponding NAND circuit 74 is at an H level. Therefore, precharge initiation signal ZPRE at an inactive state of an H level is output from a corresponding inverter circuit 76.

When precharge enable signal ZPEN is in an active state of an L level (test mode), the output signal of respective logic gate 75 attains an H level, whereby precharge initiation signal ZPRE output from respective inverter circuit 76 attains an active state of an L level.

Precharge command control circuit 62 will be described hereinafter.

Precharge command control circuit 62 includes logic gates 65 and 66, an NOR circuit 67, a NAND circuit 68, inverter circuits 64 and 69, and a one shot pulse generation circuit 72.

Inverter circuit 64 receives precharge command signal PRECF. Logic gate 65 receives an output signal of inverter circuit 64 at its first input node, and a test mode signal ZMS2 at its second input node. Logic gate 66 receives an output signal of logic gate 65 at its first input node, and the output signal of NAND circuit 68 at its second input node. NOR circuit 67 receives test mode signal ZMS2 at its first input node, and a signal ZBWE from first input stage 16 of FIG. 8 at its second input node. Here, signal ZBWE is an internal signal of the same phase corresponding to external control signal /WE.

NAND circuit 68 receives output signal S2 of logic gate 66 at its first input gate and an output signal of NOR circuit 67 at its second input gate.

Logic gates 65 and 66, NOR circuit 67, NAND circuit 68 and inverter circuit 64 form a latch circuit 70. Latch circuit 70 provides a signal S2 of an H level corresponding to signal PRECF when signal ZBWE is at an L level, and provides signal S2 of an L level when signal attains an H level in a test mode. In a normal mode, signal S2 is fixed at an H level.

One shot pulse generation circuit 72 receives output signal S2 of logic gate 66. One shot pulse generation circuit 72 responds to a fall of signal S2 to output a one shot pulse of an H level. Inverter circuit 69 inverts the pulse output from one shot pulse generation circuit 72 to output a precharge enable signal ZPEN of an L level.

The operation of precharge signal generation circuit 110.1 in a test mode will be described hereinafter with reference to the flow charts of FIGS. 10A–10E.

FIGS. 10A, 10B, 10C, 10D and 10E show a precharge command signal PRECF, a signal S2, a precharge enable signal ZPEN, a signal ZBWE, and a precharge initiation signal ZPRE, respectively. It is assumed that test mode signal ZMS2 is in an active state (test mode) of an L level.

Referring to FIGS. 10A–10E, at the time point (time t0) of input of precharge command PRE, signal ZBWE is at an L level. Therefore, signal S2 is pulled up to an H level at time t1. Since precharge enable signal ZPEN maintains an H level, the precharge command information is not transmitted to each bank.

At time t2, signal ZBWE is set at an H level in response to external control (external control signal /WE is pulled up to an H level). In response, signal S2 is pulled down to an L level. In response to this fall of signal S2, one shot pulse generation circuit 72 outputs a pulse of an L level.

At time t3, precharge enable signal ZPEN attains an active state of an L level. As a result, all precharge initiation signals ZPRE attain an active state of an L level.

In response, inactivation of respective banks is initiated (lagging the actual input time point of precharge command PRE).

In response to precharge enable signal ZPEN subsequently attaining an inactive state of an H level, precharge initiation signal ZPRE is driven to an H level of an inactive state. As a result, all precharge initiation signals ZPRE attain an inactive state of an H level.

When act command ACT is input (time t4) at the next input timing of the external clock signal CLK, the duration between time t3 and time t4 becomes the tRP period.

More specifically, by provision of precharge signal generation circuit 110.1 in synchronous semiconductor memory device 2000, transmission of the precharge command information to a bank can be adjusted. It is therefore possible to sufficiently delay the inactive timing of a bank than the actual input time point of precharge command PRE.

In a normal mode, precharge initiation signal ZPRE is output according to the input timing of an externally applied precharge command PRE.

Although transmission of a precharge initiation signal to a corresponding row related control circuit is adjusted using external control signal /WE, a similar object can be achieved using other signals such as external control signals /CAS, CKE, DQM, and the like.

Figure 11:
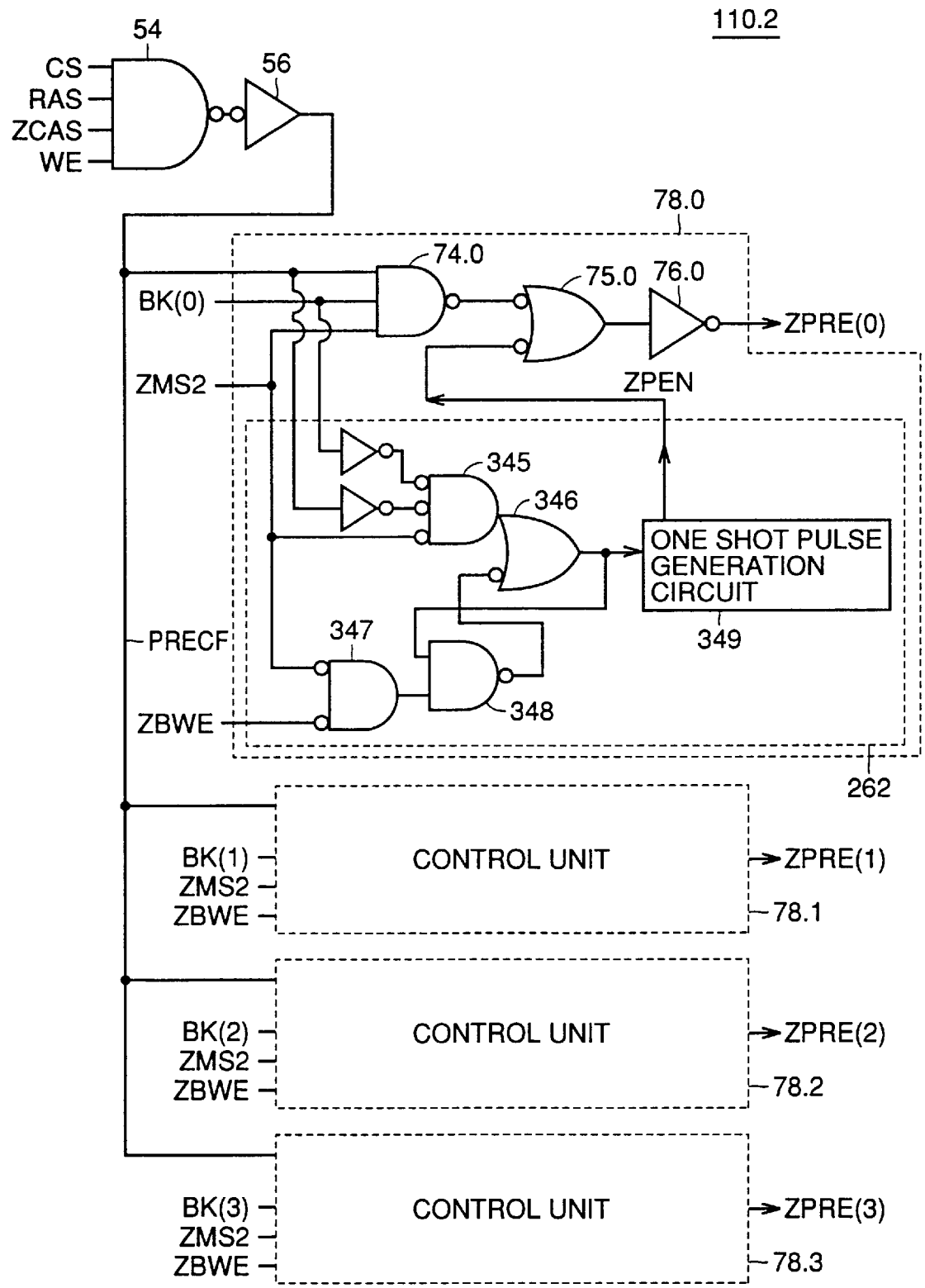
FIG. 11 is a circuit diagram showing an example of another specific structure of precharge signal generation circuit 110 according to the second embodiment.

An example of another specific structure of precharge signal generation circuit 110 of the second embodiment will be described hereinafter with reference to FIG. 11. In FIG. 11, components corresponding to those of precharge signal generation circuit 110.1 of FIG. 9 have the same reference characters allotted, and their description will not be repeated.

Referring to FIG. 11, a precharge signal generation circuit (referred to as precharge signal generation circuit 110.2 hereinafter) includes a NAND circuit 54, an inverter circuit 56, and control units 78.0, 78.1, 78.2 and 78.3. Control units 78.0, 78.1, 78.2 and 78.3 (generically referred to as control unit 78 hereinafter) are provided corresponding to banks B0, . . . , B3, respectively.

Each control unit 78 includes a corresponding NAND circuit 74, a corresponding logic gate 75, a corresponding inverter circuit 76, and a precharge command control circuit 262.

Precharge command control circuit 262 includes logic gates 345 and 346, an NOR circuit 347, a NAND circuit 348, and a one shot pulse generation circuit 349.

Figure 9:
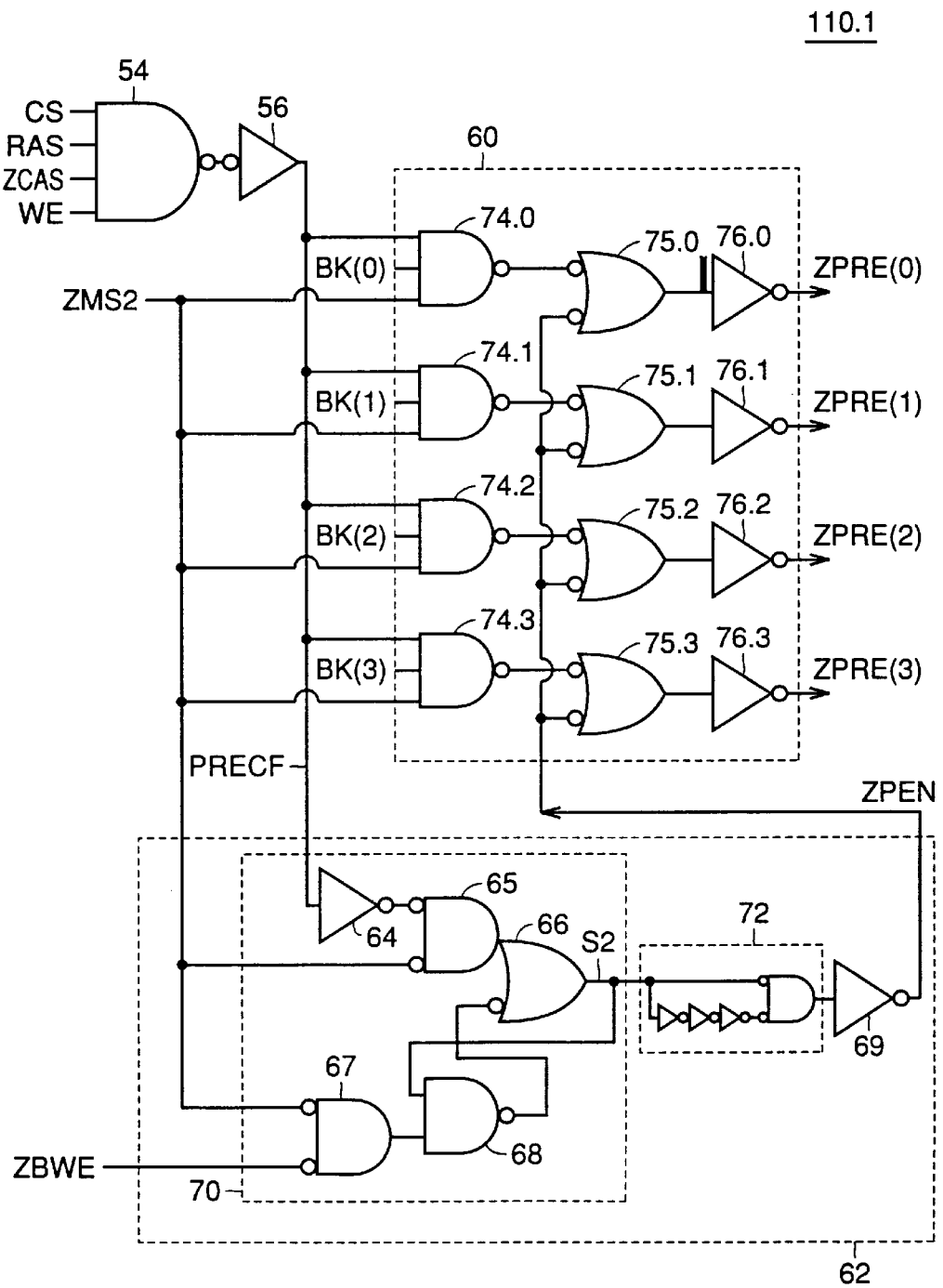
FIG. 9 is a circuit diagram showing an example of a specific structure of a precharge signal generation circuit 110 of the second embodiment.
Figure 10:
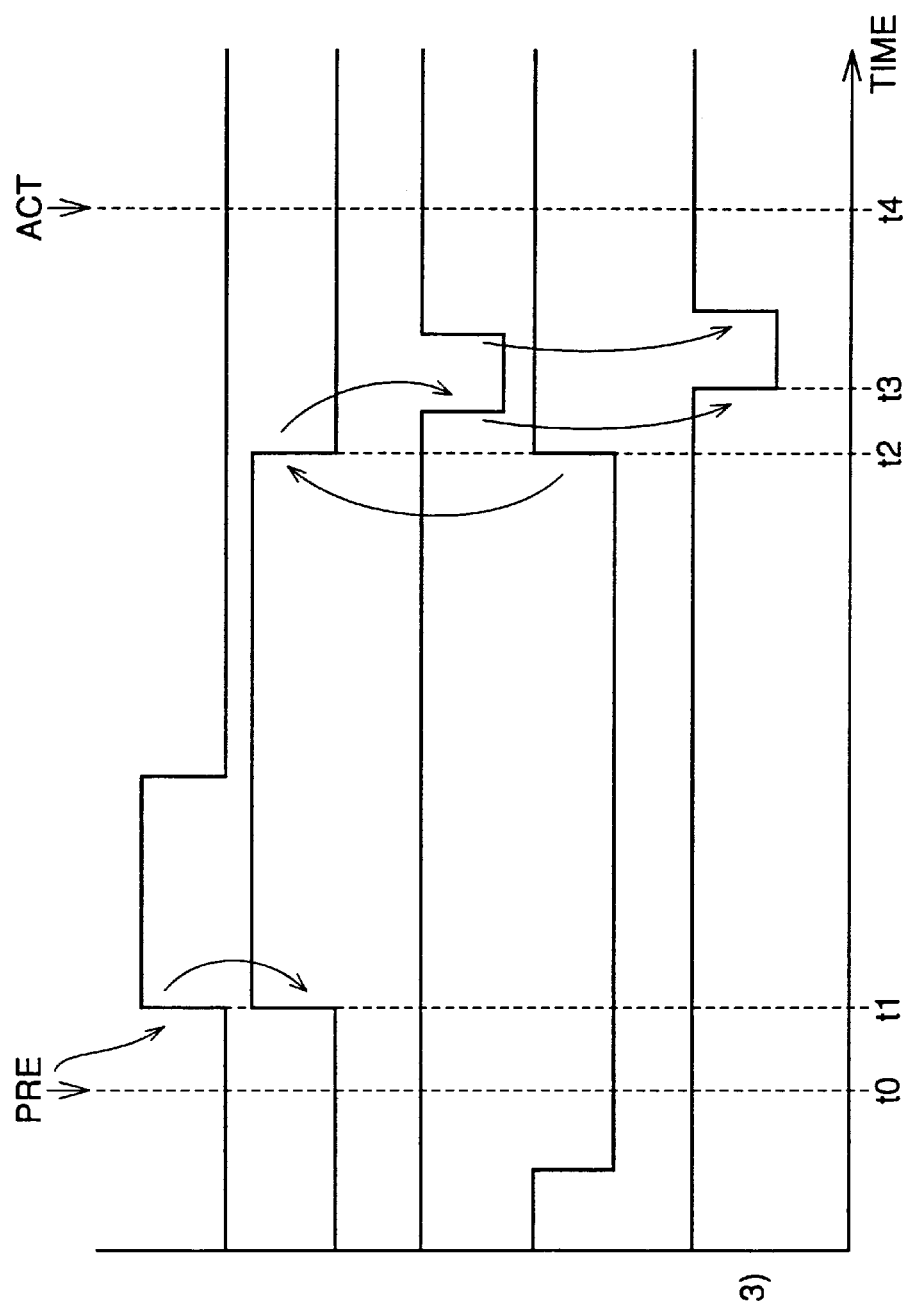
FIGS. 10A–10E are timing charts for describing an operation of a precharge signal generation circuit 110. 1 of FIG. 9.

Precharge command control circuit 262 has a structure similar to that of precharge command control circuit 62 of FIG. 9. However, in contrast to logic gate 65 of FIG. 9, a logic gate 345 receives a inverted signal (ZBK) of a corresponding bank decode signal BK at its first input node, an inverted signal of precharge command signal PRECF at its second input node, and a test mode signal ZMS2 at its third input node. Accordingly, precharge command control circuit 262 responds to a corresponding bank decode signal to provide control of the potential level of precharge enable signal ZPREN according to an external signal.

Since precharge signal generation circuit 110.2 includes a circuit for adjusting transmission of a precharge command corresponding to respective banks, the tRP period of different banks can be controlled independently while a certain bank is active.

In the synchronous semiconductor memory device of the second embodiment, a bank can be rendered inactive at a time point behind the actual input time point of a precharge command PRE. As a result, the tRP period becomes shorter than a conventional tRP period. It is therefore possible to carry out testing on a memory that operates at high speed using a test that can supply only a low speed clock signal.

Third Embodiment

A synchronous semiconductor memory device 3000 according to a third embodiment of the present invention allows arbitrary control of the active/inactive timing of a bank in a test mode.

Synchronous semiconductor memory device 3000 of the third embodiment will be described hereinafter with reference to FIG. 12.

In synchronous semiconductor memory device 3000 of the third embodiment, elements corresponding to those of conventional synchronous semiconductor memory device 9000 have the same reference characters allotted, and their description will not be repeated.

Figure 12:
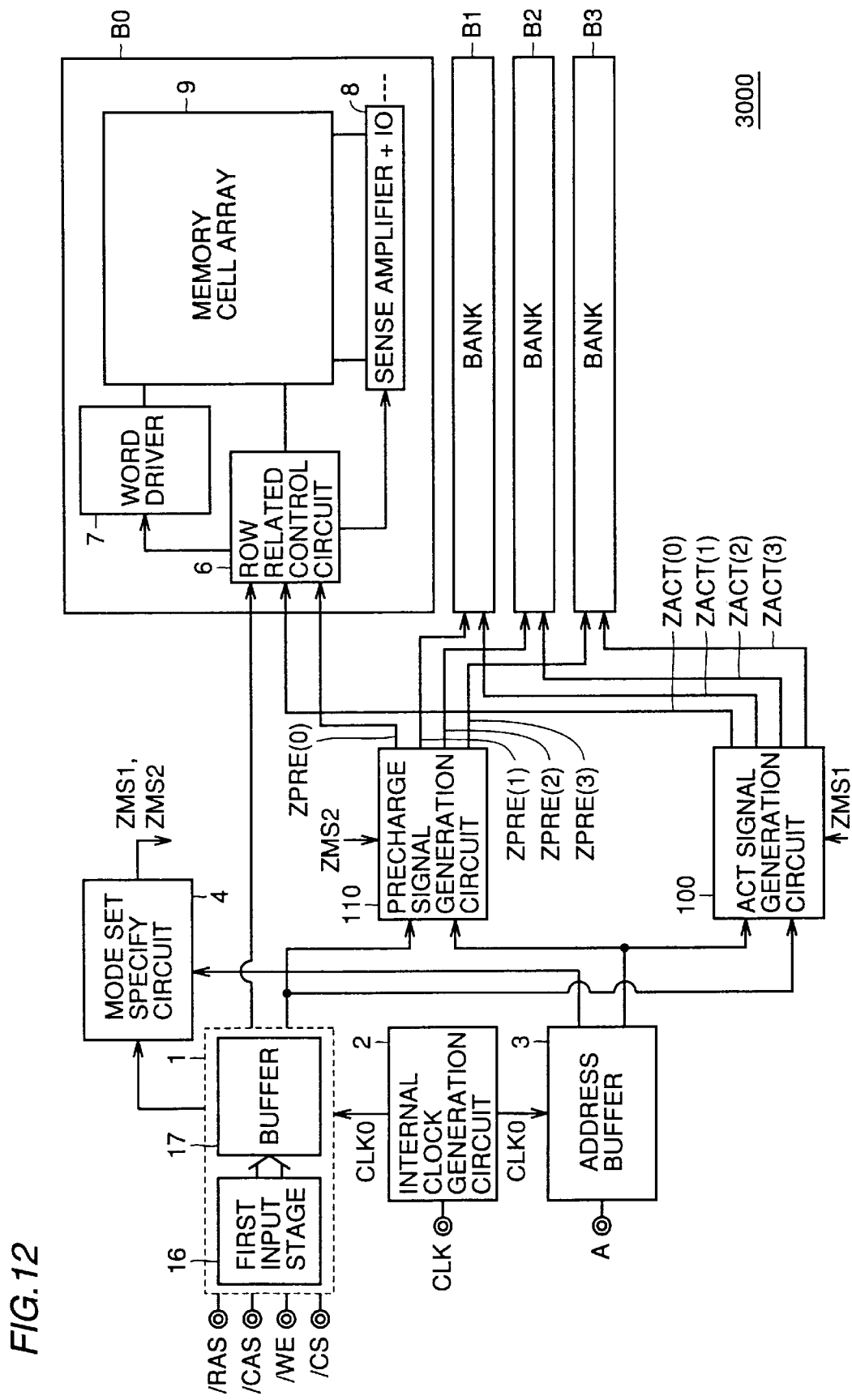
FIG. 12 is a schematic block diagram showing an example of an entire structure of a synchronous semiconductor memory device 3000 according to a third embodiment of the present invention.
Figure 13:
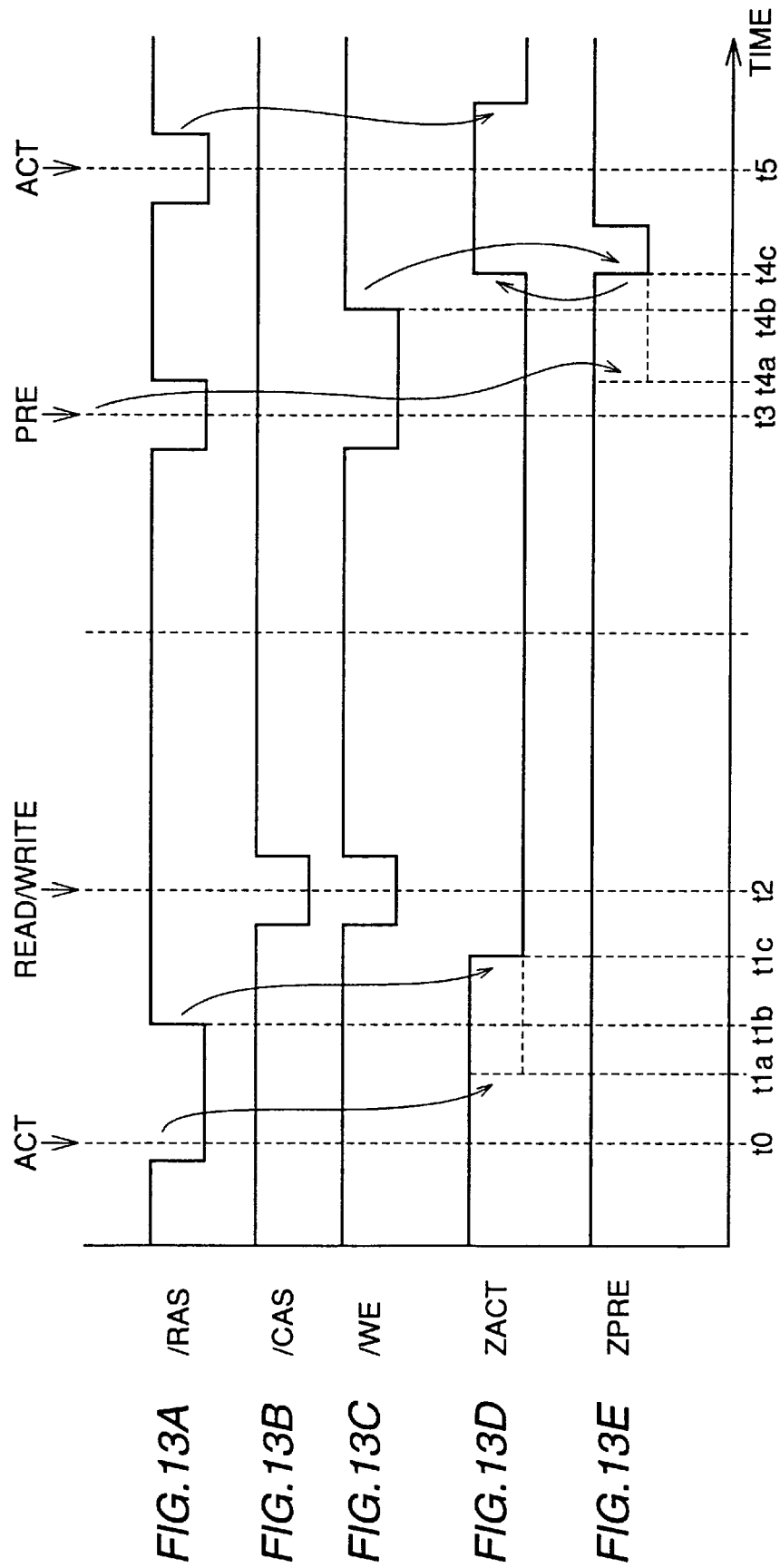
FIGS. 13A–13E are timing charts for describing an operation of synchronous semiconductor memory device 3000 of the third embodiment.

Synchronous semiconductor memory device 3000 of FIG. 12 differs from conventional synchronous semiconductor memory device 9000 in that a precharge signal generation circuit 110 is substituted for precharge signal generation circuit 12, and an act signal generation circuit 100 is substituted for act signal generation circuit 13.

In synchronous semiconductor memory device 3000, act signal generation circuit 100 allows adjustment of the transmission of active command information to a corresponding bank as described in the first embodiment. Furthermore, precharge signal generation circuit 110 allows adjustment of transmission of precharge command information to a bank as described in the second embodiment.

An operation of synchronous semiconductor memory device 3000 according to the third embodiment of the present invention in a test mode will be described with reference to the timing charts of FIGS. 13A–13E.

FIGS. 13A, 13B, 13C, 13D and 13E indicate external control signal /RAS, external control signal /CAS, external control signal /WE, act initiation signal ZACT, and precharge initiation signal ZPRE, respectively. It is assumed that test mode signals ZMS1 and ZMS2 both are in an active state of an L level (test mode).

As shown in FIGS. 13A–13E, in response to input of act command ACT at time t1, act initiation signal ZACT attains an active state of an L level (dotted line) in a conventional case. In contrast, act initiation signal ZACT of the present invention attains an active state of an L level (solid line) at time t1c by external control (external control signal /RAS pulled up to an H level from an L level at time t1b.

When precharge command PRE is input at time t3, precharge initiation signal ZPRE attains an active state of an L level at time t4a (dotted line) in a conventional case. In contrast, precharge initiation signal ZPRE of the third embodiment is rendered active of an L level (solid line) at time t4c in response to external control (external control signal /WE is pulled up to an H level from an L level at time t4b). In response, act initiation signal ZACT is pulled up to an H level.

Synchronous semiconductor memory device 3000 of the third embodiment can render a bank active lagging behind the actual input time point of act command ACT, and also render a bank inactive lagging behind the actual time point of input of precharge command PRE. Therefore, testing can be carried out on a memory of high speed operation by using a tester that can supply only a low speed clock signal.

Fourth Embodiment

A synchronous semiconductor memory device 4000 according to a fourth embodiment of the present invention allows control of the activation timing of a bank in a test mode.

Figure 14:
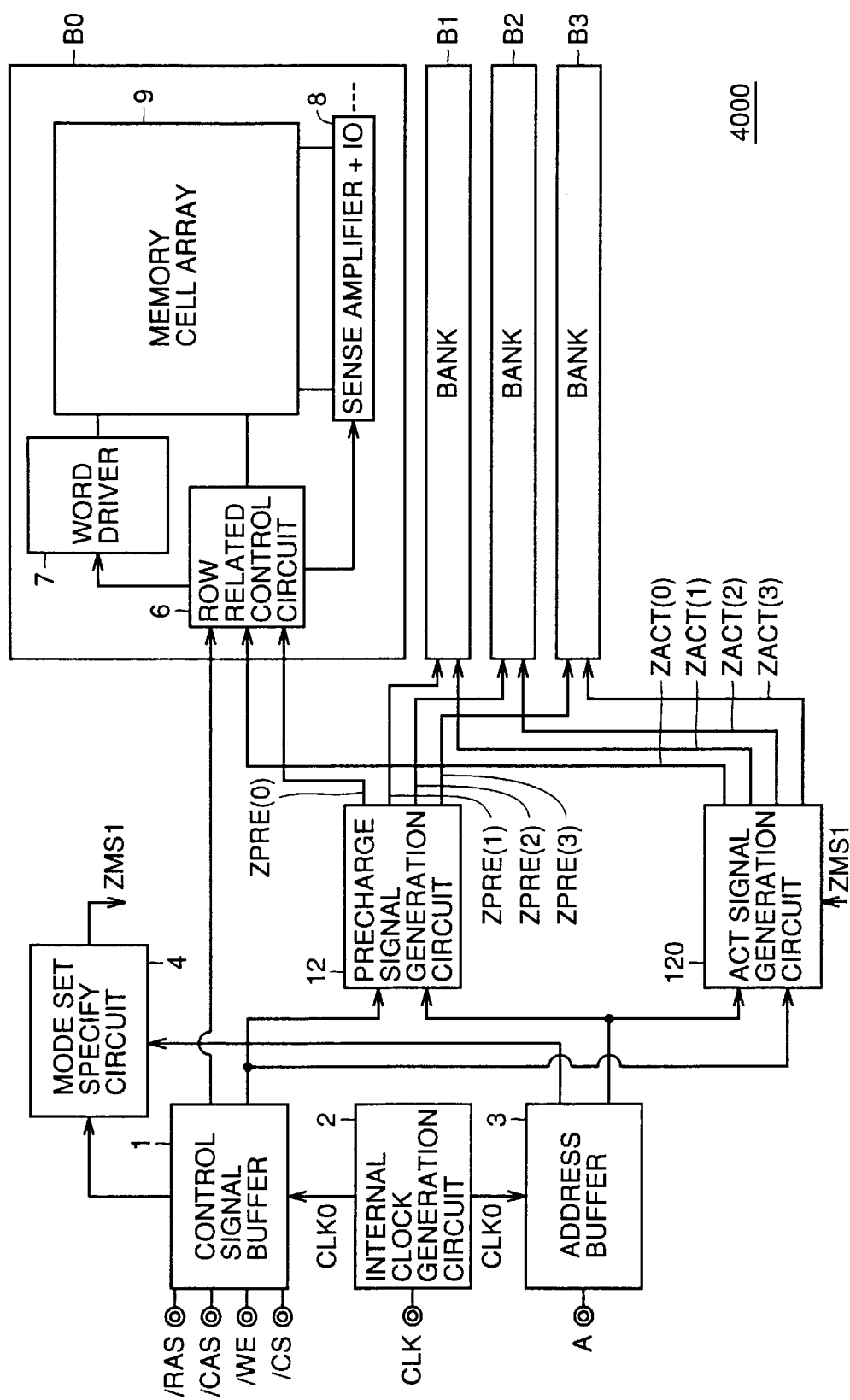
FIG. 14 is a schematic block diagram showing an example of an entire structure of a synchronous semiconductor memory device 4000 according to a fourth embodiment of the present invention.

Synchronous semiconductor memory device 4000 of the fourth embodiment will be described with reference to FIG. 14. In FIG. 14, elements corresponding to those of conventional synchronous semiconductor memory device 9000 have the same reference characters allotted, and their description will not be repeated.

Synchronous semiconductor memory device 4000 of FIG. 14 differs from conventional synchronous semiconductor memory device 9000 in that an act signal generation circuit 120 having a delay stage is substituted for act signal generation circuit 13.

Act signal generation circuit 120 has active command information corresponding to an externally applied act command ACT pass through a delay stage for output in a test mode. In a mode other than the test mode (normal mode), active command information is transmitted to a bank in response to an act command ACT as in a conventional case.

Thus, synchronous semiconductor memory device 4000 can activate a bank at a timing more delayed than the active timing of conventional synchronous semiconductor memory device 9000 in a test mode.

It is assumed that mode set specify circuit 4 detects specification of a particular test mode according to an external signal to output a test mode signal ZMS1.

An example of a specific structure of act signal generation circuit 120 of the fourth embodiment will be described hereinafter with reference to FIG. 15.

Figure 15:
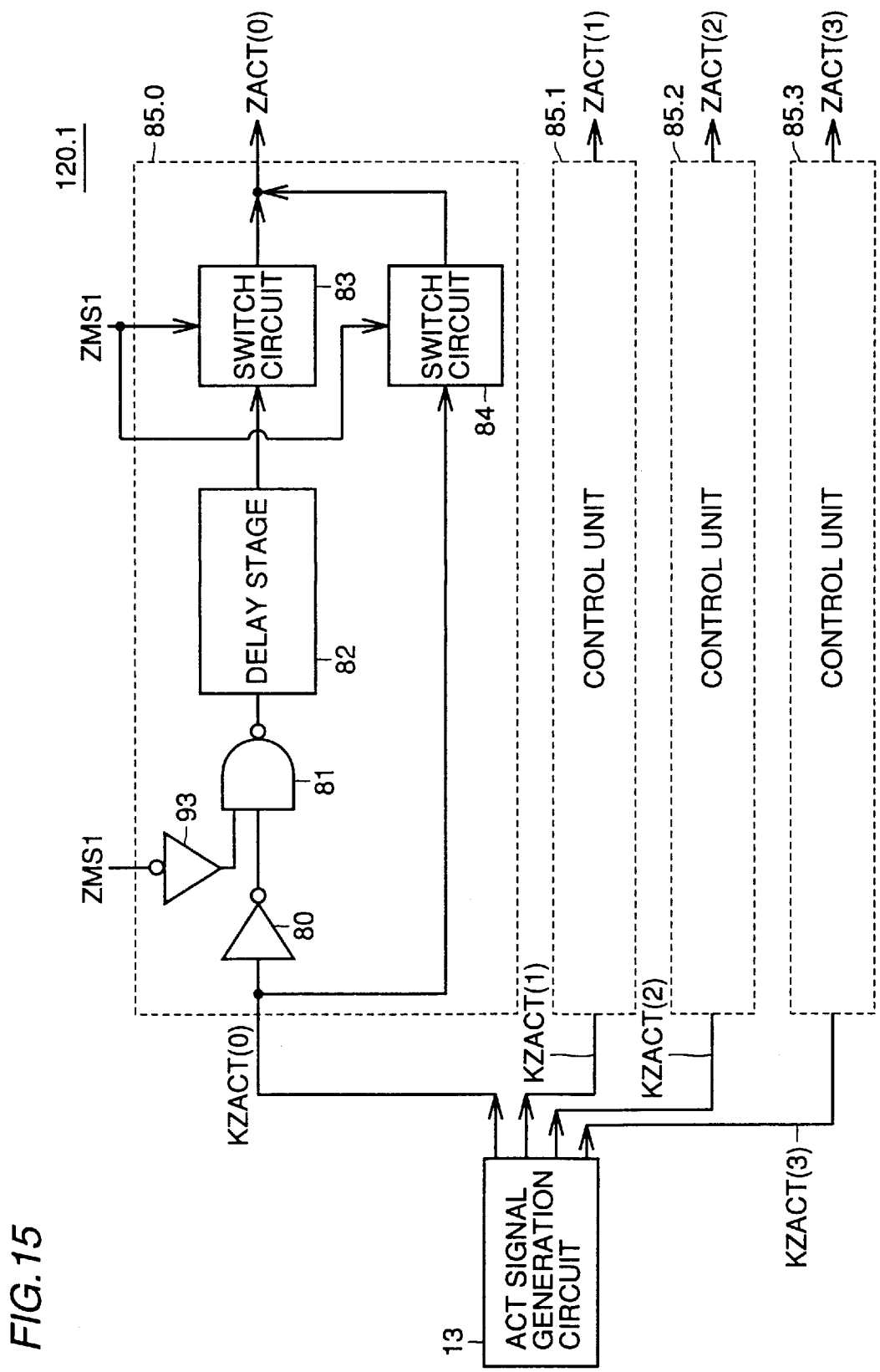
FIG. 15 is a circuit diagram showing an example of a specific structure of an act signal generation circuit 120 of the fourth embodiment.

Referring to FIG. 15, an act signal generation circuit (referred to as act signal generation circuit 120.1 hereinafter) includes a conventional act signal generation circuit 13, and control units 85.0, 85.1, 85.2 and 85.3 (generically referred to as control unit 85 hereinafter). Control units 85 are provided corresponding to banks B0, . . . , B3, respectively. For the sake of simplification, an act initiation signal output from conventional act signal generation circuit 13 is indicated as act initiation signals KZACT(0), KZACT(1), KZACT(2) and KZACT(3).

The structure of control unit 85 will be described taking control unit 85.0 as an example. Control units 85.1, 85.2 and 85.3 respectively have a structure identical to that of control unit 85.0.

Control unit 85.0 includes inverter circuits 80 and 93, a NAND circuit 81, a delay stage 82, and switch circuits 83 and 84.

Inverter circuit 80 receives a corresponding act initiation signal KZACT(0) output from act signal generation circuit 13 at its input and inverts the received signal. NAND circuit 81 receives an inverted version of test mode signal ZMS1 via inverter circuit 93 at its first input node, and an output signal of inverter circuit 80 at its second input node.

Delay stage 82 delays and outputs an output signal of NAND circuit 81. Switch circuit 83 responds to test mode signal ZMS1 to output the signal provided from delay stage 82. Switch circuit 84 responds to test mode signal ZMS1 to output a corresponding act initiation signal ZKACT(0). The signal output from either switch circuit 84 or 83 is provided to a corresponding bank as act initiation signal ZACT.

More specifically, in a test mode (for example, when test mode signal ZMS1 is in an active state of an L level), switch circuit 83 outputs the delayed signal as act initiation signal ZACT(0). In a normal mode (in a mode other than the test mode), switch circuit 84 outputs act initiation signal KZACT(0) directly as act initiation signal ZACT(0).

Switch circuits 83 and 84 can be implemented by, for example, a transmission gate.

An operation of act signal generation circuit 120.1 in a test mode will be described hereinafter with reference to the timing charts of FIGS. 16A–16C.

Figure 16:
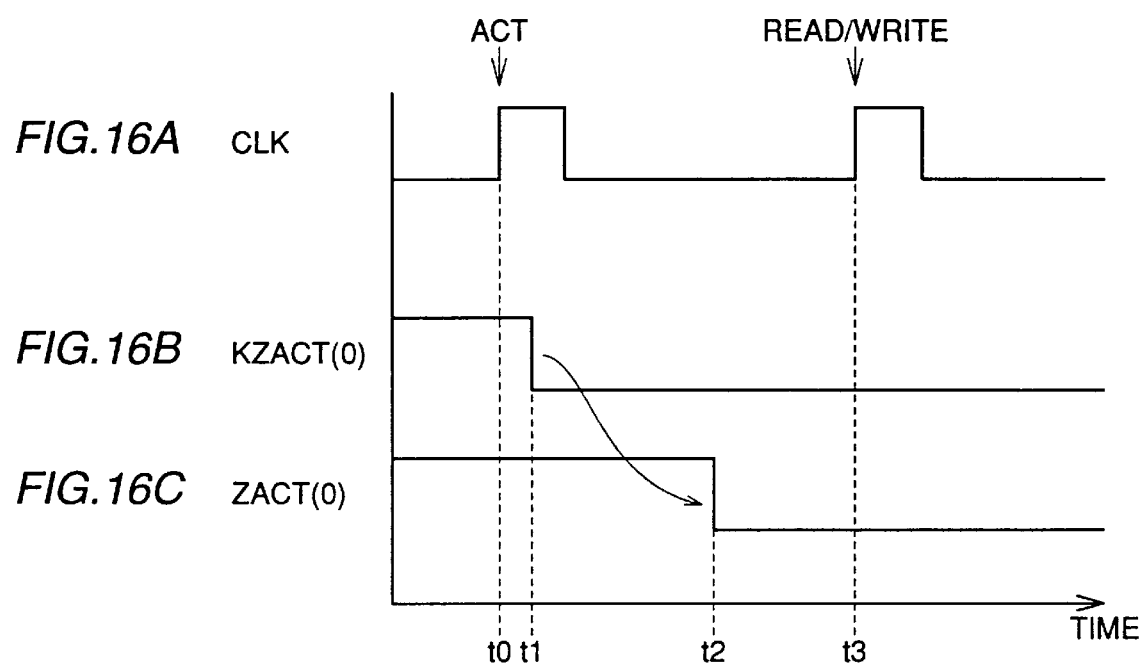
FIGS. 16A–16C are timing charts for describing an operation of an act signal generation circuit 120.1 of FIG. 15.

FIGS. 16A, 16B, and 16C show external clock signal CLK, act initiation signal KZACT(0), and an eventual act initiation signal ZACT(0), respectively. It is assumed that test mode signal ZMS1 is in an active state of an L level (test mode).

Referring to FIGS. 16A–16C, input of act command ACT at time t0 causes transition of a corresponding act initiation signal KZACT(0) from an H level to an L level corresponding to a specified bank (bank B0, for example) at time t1. Act initiation signal KZACT(0) is delayed by delay stage 82. As a result, the eventual act initiation signal ZACT(0) in an active state of an L level is generated at time t2. In response, activation of bank B0 is initiated lagging behind the actual input time point of act command ACT.

When a read or write command (READ/WRITE) is input at the next input timing of the external clock signal CLK (time t3), the duration between time t2 to time t3 corresponds to the tRCD period.

Figure 17:
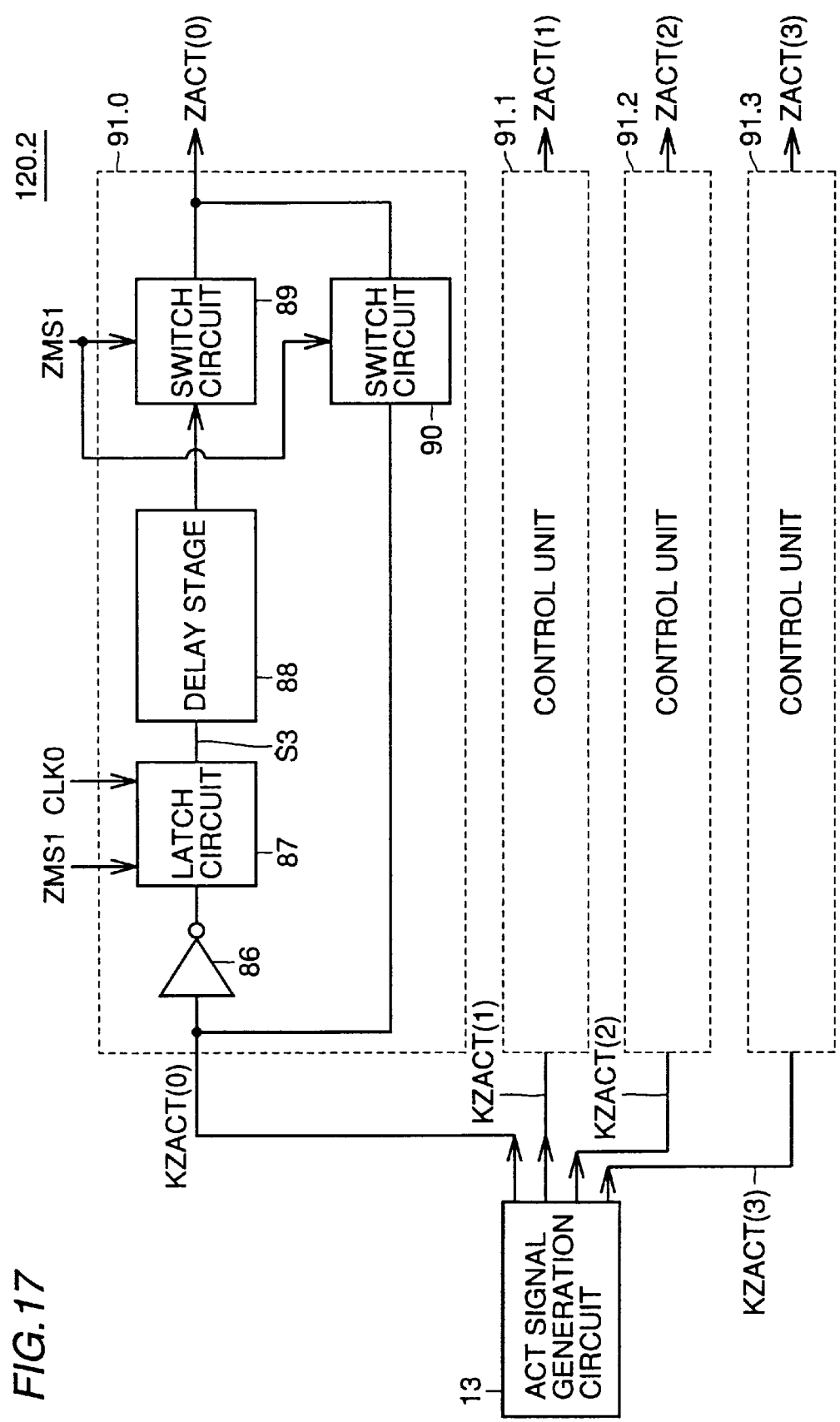
FIG. 17 is a circuit diagram showing an example of another structure of act signal generation circuit 120 of the fourth embodiment.
Figure 18:
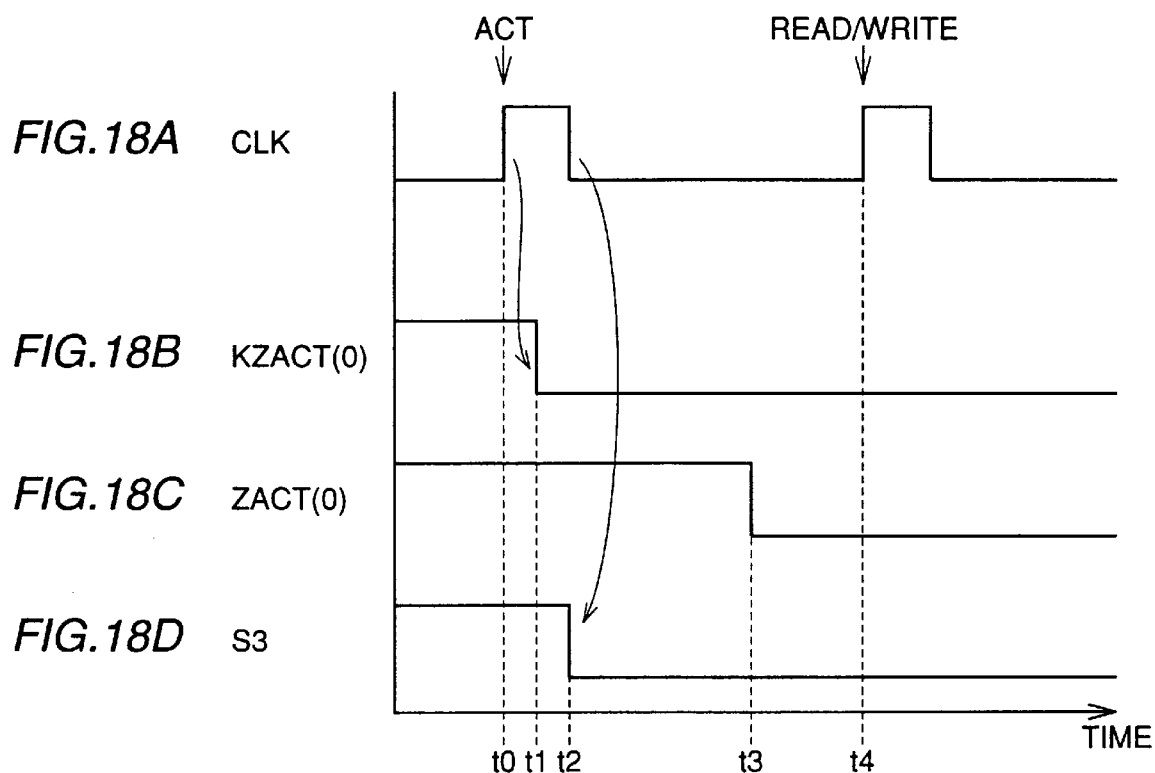
FIGS. 18A–18D are timing charts for describing an operation of act signal generation circuit 120.2 of FIG. 17.

An example of another specific structure of act signal generation circuit 120 of the fourth embodiment will be described with reference to FIG. 17.

An act signal generation circuit of FIG. 17 (referred to as act signal generation circuit 120.2 hereinafter) includes a conventional act signal generation circuit 13, and control units 91.0, 91.1, 91.2 and 91.3. Control units 91.0, 91.1, 91.2 and 91.3 (generically referred to as control unit 91 hereinafter) are provided corresponding to banks B0, . . . , B3, respectively.

The structure of control unit 91 will be described hereinafter taking control unit 91.0 as an example. Control units 91.1, 91.2 and 91.3 respectively have a structure identical to that of control unit 91.0.

Control unit 91.0 includes an inverter circuit 86, a latch circuit 87, a delay stage 88, and switch circuits 89 and 90.

Inverter circuit 86 receives a corresponding act initiation signal KZACT(0) at its input to invert the same for output. Latch circuit 87 latches an output signal of inverter circuit 86 according to test mode signal ZMS1 and internal clock signal CLK0. Delay stage 88 delays output signal S3 of latch circuit 87 for output. Switch circuit 89 outputs the signal from delay stage 88 according to test mode signal ZMS1. Switch circuit 90 outputs act initiation signal KZACT(0) according to test mode signal ZMS1. The signal output from either switch circuit 89 or 90 is output to a corresponding bank B0 as the eventual act initiation signal ZACT(0).

More specifically, in a test mode (for example, test mode signal ZMS1 at an L level), switch circuit 89 outputs the signal from delay stage 88 as act initiation signal ZACT(0). In a normal mode (mode other than test mode), act initiation signal KZACT(0) itself is output as the final act initiation signal ZACT(0) via switch circuit 90.

An operation of act signal generation circuit 120.2 in a test mode will be described hereinafter with reference to the timing charts of FIGS. 18A–18D. FIGS. 18A, 18B, 18C and 18D show external clock signal CLK, act initiation signal KZACT(0), eventual act initiation signal ZACT(0), and an output signal S3 of latch circuit 87, respectively. It is assumed that test mode signal ZMS1 is in an active state of an L level (test mode).

Referring to FIGS. 18A–18D, input of act command ACT at time t0 causes transition of act initiation signal KZACT(0) corresponding to a specified bank (bank B0, for example) from an H level to an L level at time t1. At the fall of external clock signal CLK (or internal clock signal CLK0) from an H level to an L level (time t2), latch circuit 87 latches and outputs the signal from inverter circuit 86. The latched signal is further delayed by delay stage 88. Thus, act initiation signal ZACT(0) of an L level is output (time t3) delayed than the time point of the actual input of act command ACT.

When a read or write command (READ/WRITE) is specified (time t4) at the rise of the next external clock signal CLK (or internal clock signal CLK0), the duration between time t3 and time t4 becomes the tRCD period.

The provision of act signal generation circuit 120 in synchronous semiconductor memory device 4000 allows transmission of active command information to be adjusted. Therefore, the active timing of a bank can be sufficiently delayed than the actual input time point of act command ACT.

Furthermore, since act signal generation circuit 120.2 initiates delay with the fall timing of an internal clock signal as a trigger, the required amount of the delay stage can be reduced than that of act signal generation circuit 120.1.

Thus, a bank can be rendered active lagging behind the actual input time point of act command ACT in synchronous semiconductor memory device 4000 of the fourth embodiment. As a result, the tRCD period can be made shorter than the conventional tRCD period. Also, testing can be carried out on a memory of high speed operation using a tester that can supply only a low speed clock signal.

Fifth Embodiment

A synchronous semiconductor memory device 5000 according to a fifth embodiment of the present invention allows the inactivation timing of bank to be controlled in a test mode.

Figure 19:
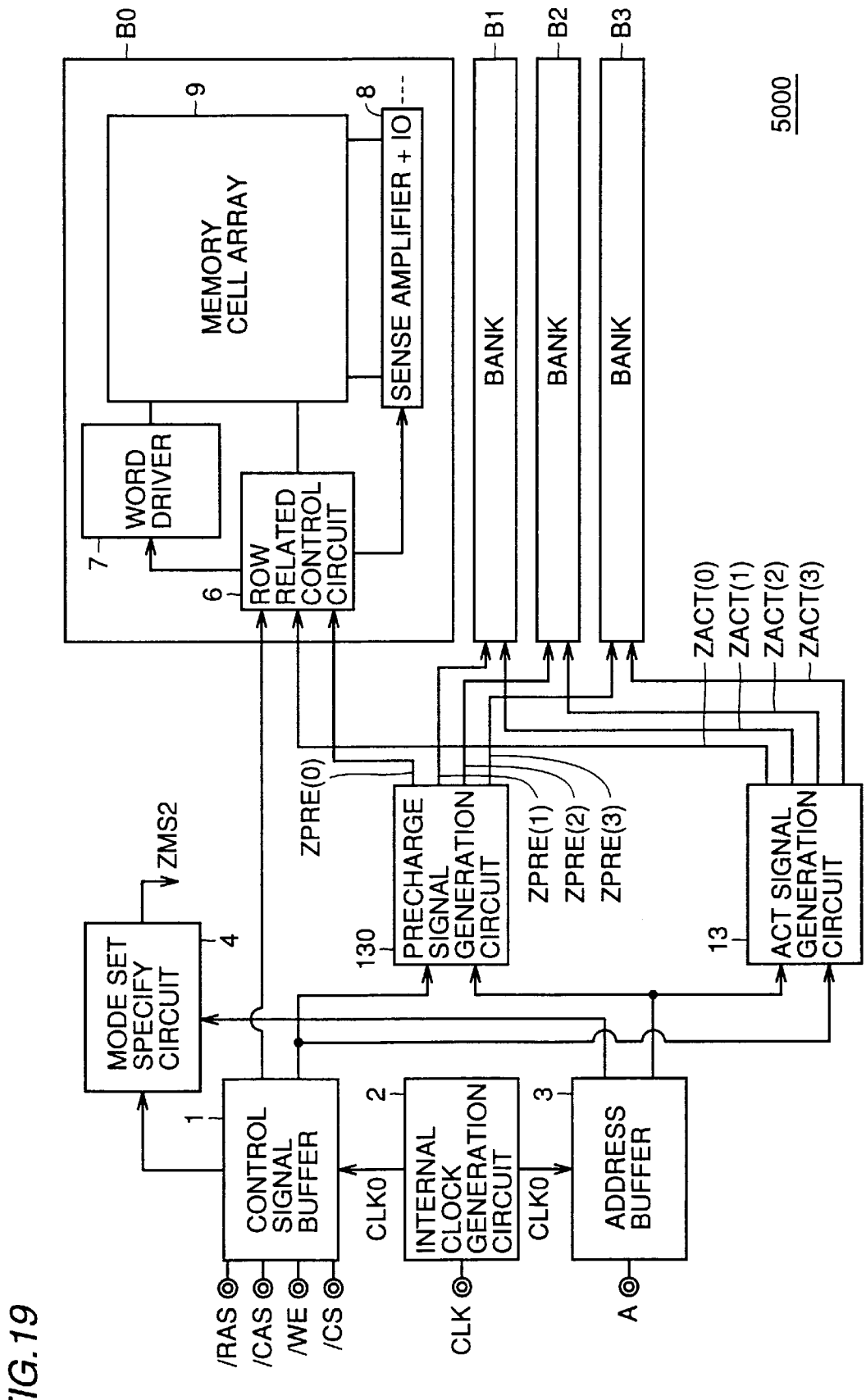
FIG. 19 is a schematic block diagram showing an example of an entire structure of a synchronous semiconductor memory device 5000 according to a fifth embodiment of the present invention.

Synchronous semiconductor memory device 5000 of the fifth embodiment will be described hereinafter with reference to FIG. 19. In FIG. 19, elements corresponding to those of conventional synchronous semiconductor memory device 9000 have the same reference characters allotted, and their description will not be repeated.

Synchronous semiconductor memory device 5000 of the fifth embodiment shown in FIG. 19 differs from conventional synchronous semiconductor memory device 9000 in that a precharge signal generation circuit 130 including a delay stage is provided instead of precharge signal generation circuit 12.

Precharge signal generation circuit 130 passes precharge command information corresponding to an externally applied precharge command PRE through a delay stage for output in a test mode. In a mode other than the test mode (normal mode), precharge command information is transmitted to a bank in response to precharge command PRE in a conventional manner.

In a test mode, synchronous semiconductor memory device 5000 can render a bank inactive at a timing more delayed than the inactive timing of conventional synchronous semiconductor memory device 9000.

It is assumed that mode set specify circuit 4 detects specification of a particular test mode according to an external signal to output test mode signal ZMS2.

An example of a specific structure of precharge signal generation circuit 130 of the fifth embodiment will be described hereinafter with reference to FIG. 20.

Figure 20:
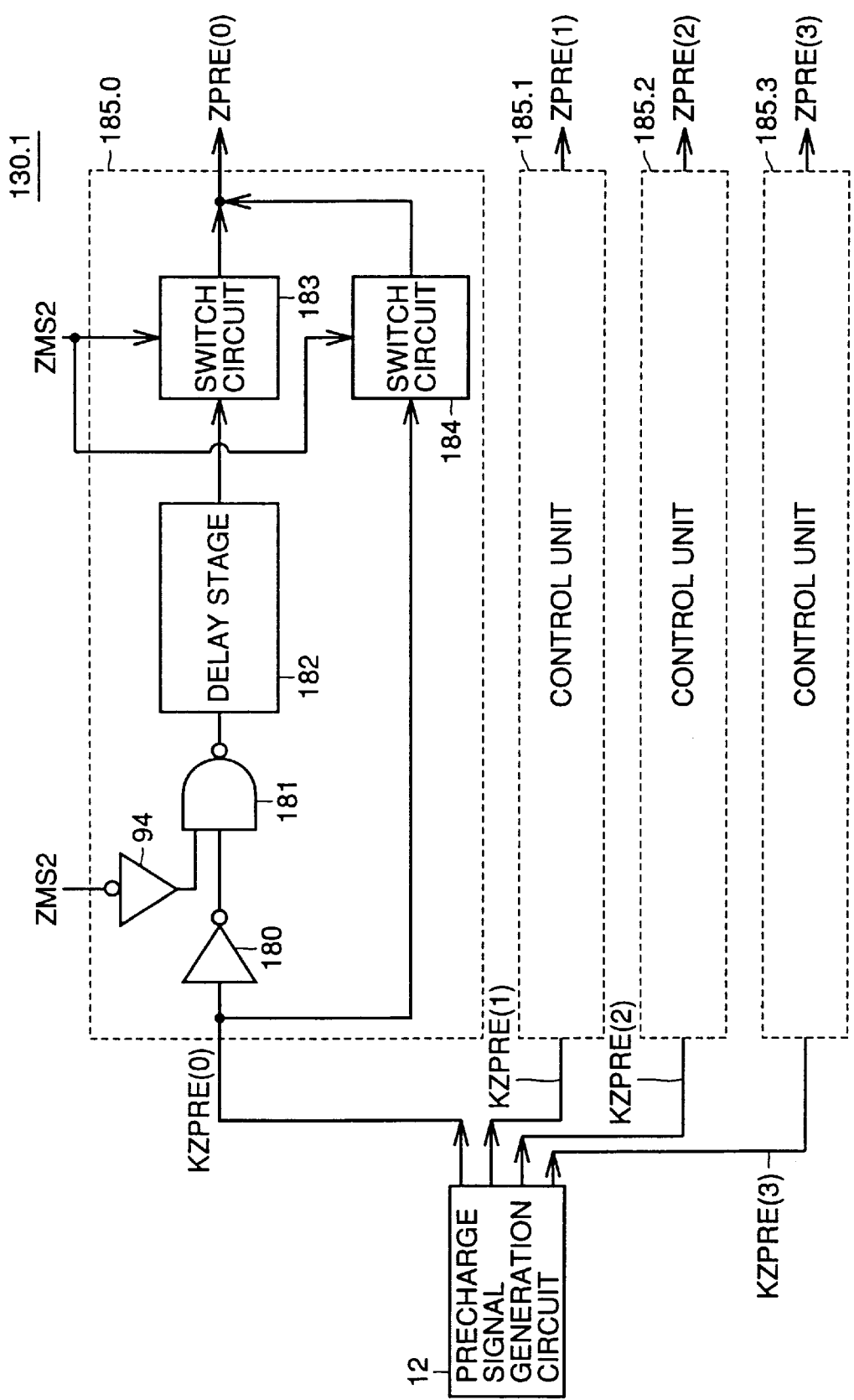
FIG. 20 is a circuit diagram showing an example of a specific structure of a precharge signal generation circuit 130 according to the fifth embodiment.

Referring to FIG. 20, a precharge signal generation circuit (referred to as precharge signal generation circuit 130.1 hereinafter) includes a conventional precharge signal generation circuit 12 and control units 185.0, 185.1, 185.2, and 185.3 (generically referred to as control unit 185 hereinafter). Respective control units 185 are provided corresponding to banks B0, . . . , B3, respectively. For the sake of simplification, the precharge initiation signal output from conventional precharge signal generation circuit 12 is indicated as precharge initiation signals KZPRE(0), KZPRE(1), KZPRE(2) and KZPRE(3).

The structure of control unit 185 will be described with control unit 185.0 as an example. Control units 185.1, 185.2 an 185.3 respectively have a structure identical to that of control unit 185.0.

Control unit 185.0 includes inverter circuits 180 and 94, a NAND circuit 181, a delay stage 182, and switch circuits 183 and 184.

Inverter circuit 180 receives a corresponding act initiation signal KZPRE(0) output from precharge signal generation circuit 12 and inverts the same. NAND circuit 181 receives an inverted signal of test mode signal ZMS2 via inverter circuit 94 at its first input node and an output signal of inverter circuit 180 at its second input node.

Delay stage 182 delays and outputs a signal output from NAND circuit 181. Switch circuit 183 receives a signal output from delay stage 182. Switch circuit 184 receives a corresponding precharge initiation signal KZPRE(0). In a test mode (for example, test mode signal ZMS2 at an active state of an L level), switch circuit 183 provides a delayed signal as precharge initiation signal ZPRE(0). In a normal mode (a mode other than test mode), precharge initiation signal KZPRE(0) is directly output as precharge initiation signal ZPRE(0) from switch circuit 184.

Switch circuits 183 and 184 can be implemented by a transmission gate, for example.

The operation of precharge signal generation circuit 130.1 in a test mode will be described hereinafter with reference to the timing charts of FIGS. 21A–21C.

Figure 21:
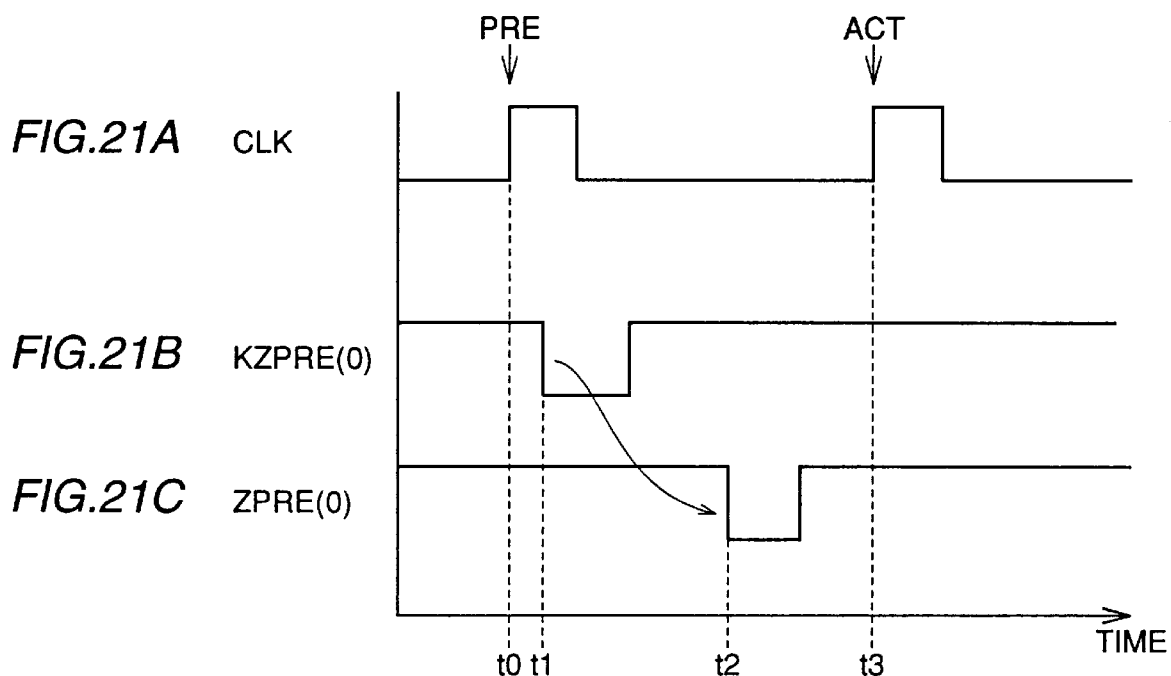
FIGS. 21A–21C are timing charts for describing an operation of a precharge signal generation circuit 130.1 of FIG. 20.

FIGS. 21A, 21B, and 21C show external clock signal CLK, precharge initiation signal KZPRE(0), and the eventual precharge initiation signal ZPRE(0). It is assumed that test mode signal ZMS2 is in an active state of an L level (test mode).

Referring to FIGS. 21A–21C, input of precharge command PRE at time t0 causes precharge initiation signal KZPRE(0) corresponding to a specified bank (for example, bank B0) to show a transition from an H level to an L level at time t1. Precharge initiation signal KZPRE(0) is delayed by delay stage 182. As a result, the final precharge initiation signal ZPRE(0) at an active state of an L level is generated at time t2.

In response, inactivation of bank B0 is initiated lagging behind the actual input time point of precharge command PRE.

When act command ACT is input at the next input timing of the external clock signal CLK (time t3), the duration between time t2 to time t3 corresponds to the tRP period.

An example of another specific structure of precharge signal generation circuit 130 of the fifth embodiment will be described hereinafter with reference to FIG. 22.

Figure 22:
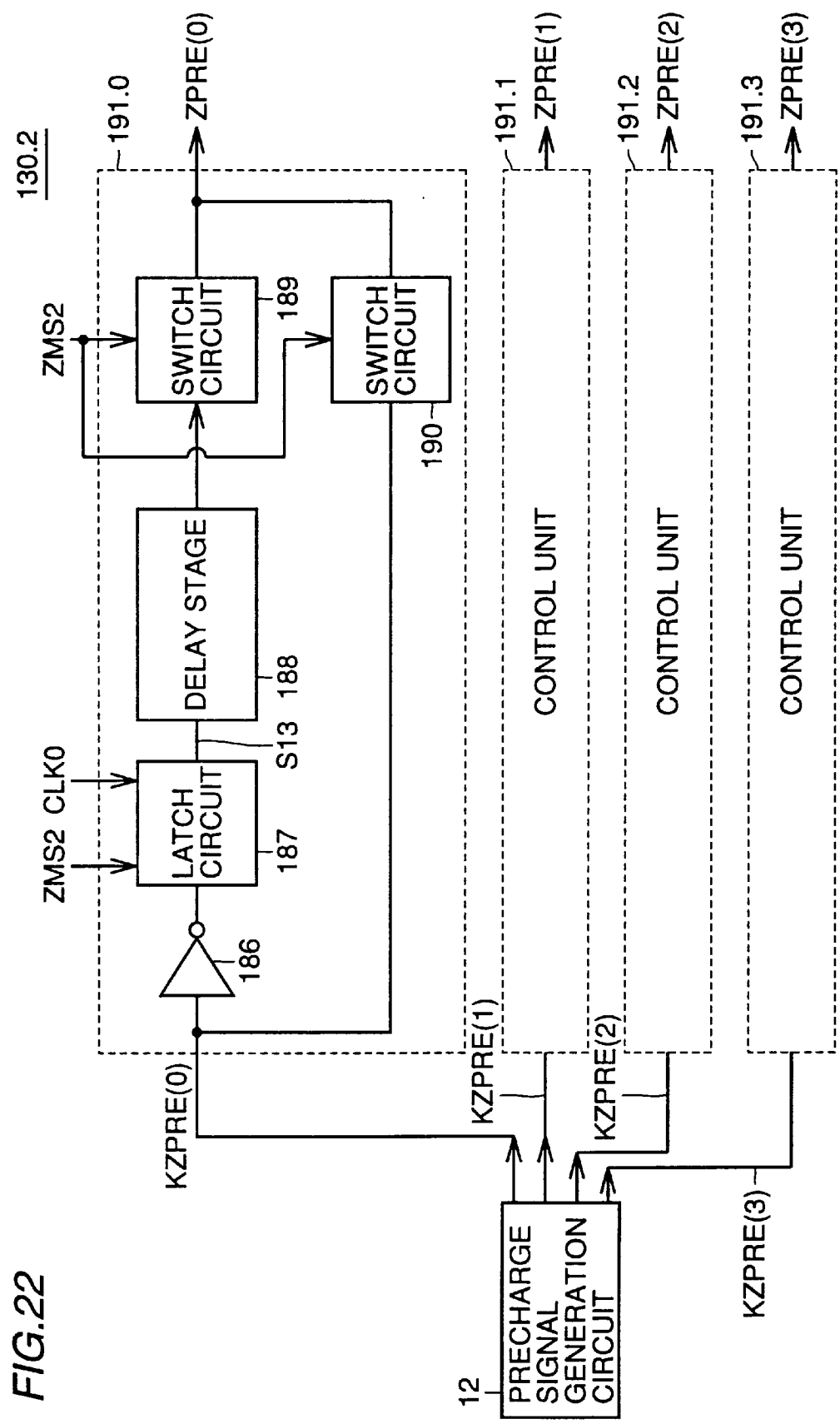
FIG. 22 is a circuit diagram showing an example of another structure of precharge signal generation circuit 130 of the fifth embodiment.
Figure 23:
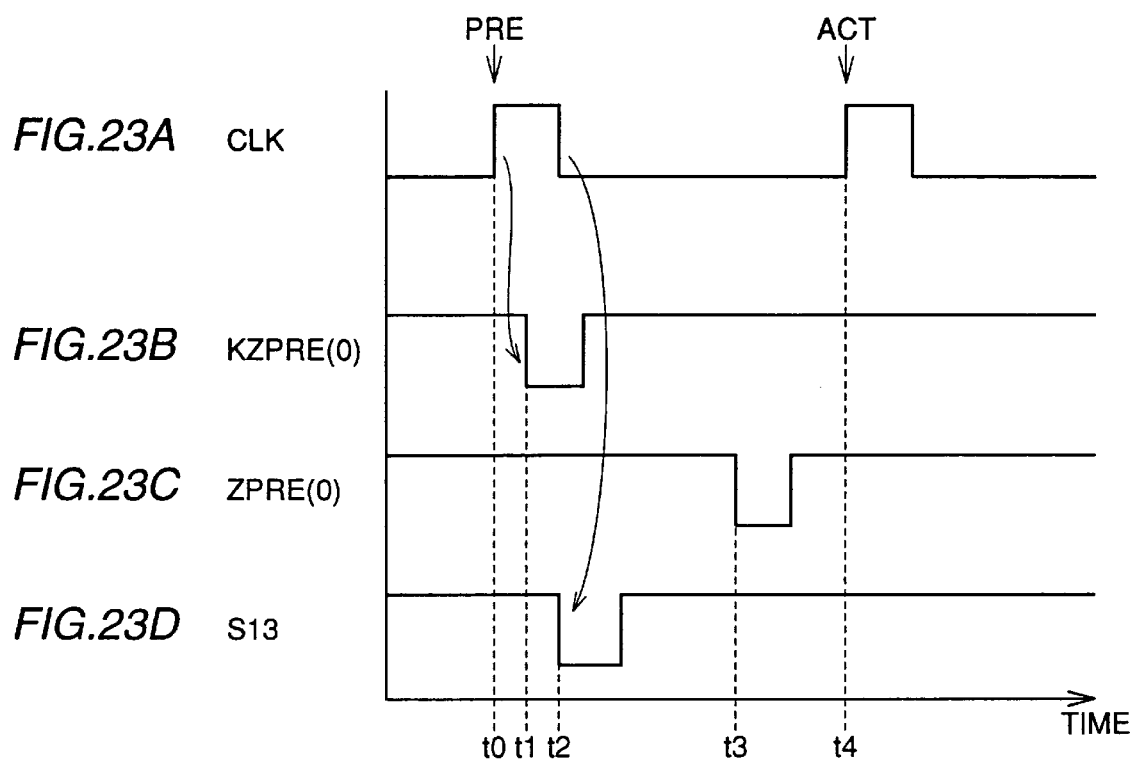
FIGS. 23A–23D are timing charts for describing an operation of a precharge signal generation circuit 130. 2 of FIG. 22.

Referring to FIG. 22, a precharge signal generation circuit (referred to as precharge generation circuit 130.2 hereinafter) includes a conventional precharge signal generation circuit 12, and control units 191.0, 191.1, 191.2 and 191.3. Control units 191.0, 191.1, 191.2 and 191.3 (generically referred to as control unit 191 hereinafter) are provided corresponding to banks B0, . . . , B3, respectively.

A structure of control unit 191 will be described taking control unit 191.0 as an example. Control units 191.1, 191.2 and 191.3 respectively have a structure identical to that of control unit 191.0.

Control unit 191.0 includes an inverter circuit 186, a latch circuit 187, a delay stage 188, and switch circuits 189 and 190.

Inverter circuit 186 inverts a corresponding precharge initiation signal KZPRE(0) received at its input. Latch circuit 187 latches the output signal from inverter circuit 186 according to test mode signal ZMS2 and internal clock signal CLK0.

Delay stage 188 delays output signal S13 of latch circuit 187 for output. Switch circuit 189 receives the signal output from delay stage 188. Switch circuit 190 receive precharge initiation signal KZPRE(0). In a test mode (for example, test mode signal ZMS1 is at an L level), switch circuit 189 provides the output signal from delay stage 188 as precharge initiation signal ZPRE(0). In a normal mode (a mode other than test mode), precharge initiation signal KZPRE(0) is directly output as the eventual precharge initiation signal ZPRE(0) from switch circuit 190.

The operation of precharge signal generation circuit 130.2 in a test mode will be described hereinafter with reference to the timing charts of FIGS. 23A–23D.

FIGS. 23A, 23B, 23C and 23D show external clock signal CLK, precharge initiation signal KZPRE(0), eventual precharge initiation signal ZPRE(0), and output signal S13 of latch circuit 187, respectively. It is assumed that test mode signal ZMS2 is at an active state of an L level (test mode).

Referring to FIGS. 23A–23D, input of precharge command PRE at time t0 causes a fall of precharge initiation signal KZPRE(0) of a corresponding bank to an L level at time t1. At the time point of the fall of external clock signal (or internal clock signal CLK0) from an H level to an L level (time t2), latch circuit 187 latches the signal from inverter circuit 186 for output. The latched signal is then delayed by delay stage 188. As a result, the last precharge initiation signal ZPRE(0) of an L level is output at a time point (time t3) behind the actual input time point of precharge command PRE.

When a precharge command PRE is input at the rising timing of the next external clock signal CLK (time t4), the duration between time t3 and time t4 becomes the tRP period.

The provision of precharge signal generation circuit 130 in synchronous semiconductor memory device 5000 allows transmission of the precharge command information to be adjusted. Thus, the inactivation timing of a bank can be sufficiently delayed than the actual input time point of precharge command PRE.

Furthermore, since precharge signal generation circuit 130.2 initiates the delay with the fall of internal clock signal as a trigger, the required amount of the delay stage can be reduced than that of precharge signal generation circuit 130.1.

It is therefore possible to inactivate a bank behind the actual input time point of precharge command PRE in synchronous semiconductor memory device 5000 of the fifth embodiment. As a result, the tRP period can be made shorter than the conventional tRP period. Thus, testing can be applied on a memory that carries out high speed operation using a tester that can supply only a low speed clock signal.

Sixth Embodiment

A synchronous semiconductor memory device 6000 according to a sixth embodiment of the present invention allows arbitrary control of the activation/inactivation timing of a bank in a test mode.

Figure 24:
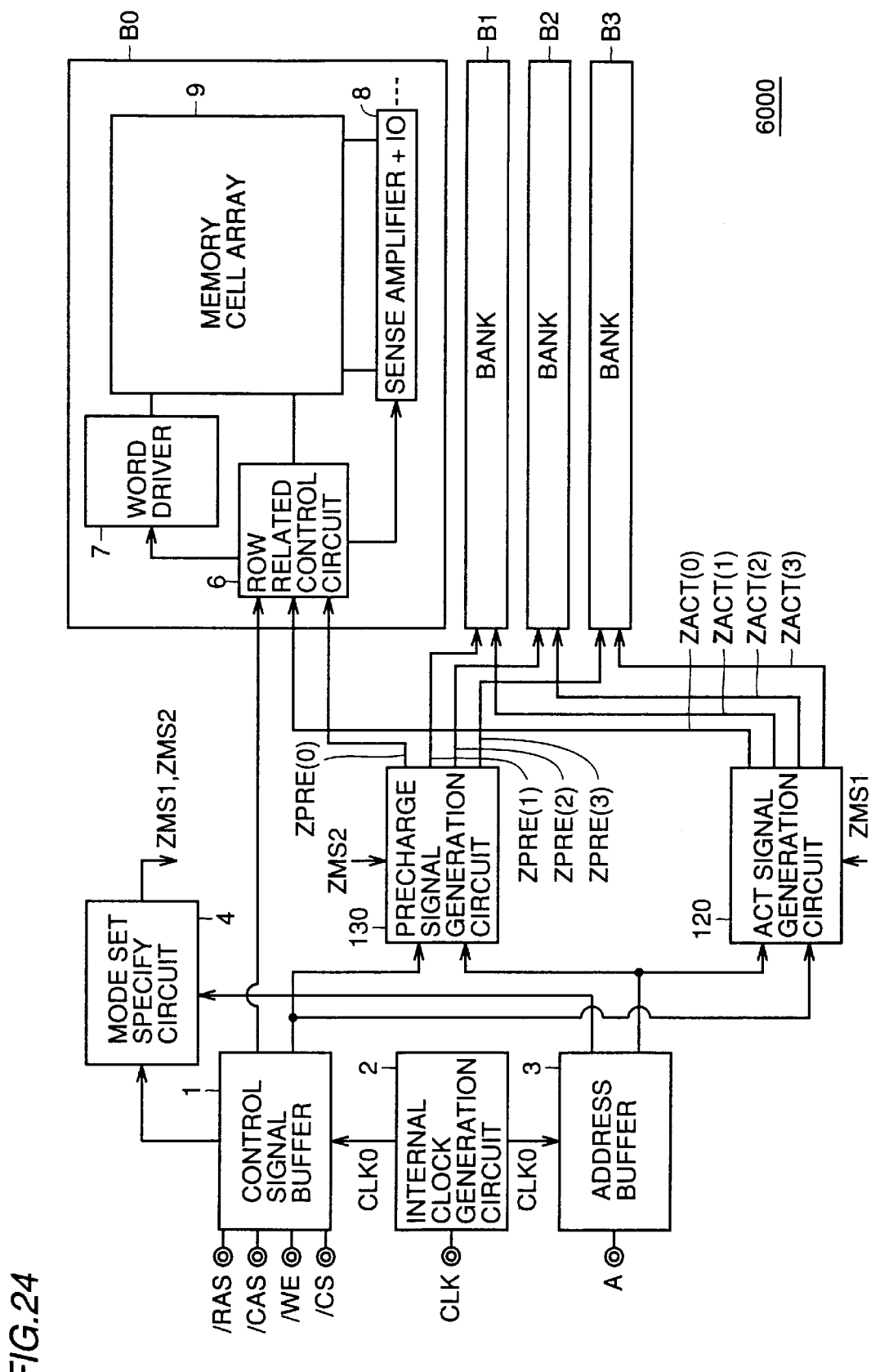
FIG. 24 is a schematic block diagram showing an example of an entire structure of a synchronous semiconductor memory device 6000 according to a sixth embodiment of the present invention.

Synchronous semiconductor memory device 6000 of the sixth embodiment will be described hereinafter with reference to FIG. 24. In FIG. 24, elements corresponding to those of conventional synchronous semiconductor memory device 9000 have the same reference characters allotted, and their description will not be repeated.

Synchronous semiconductor memory device 6000 of FIG. 24 differs from conventional synchronous semiconductor memory device 9000 in that a precharge signal generation circuit 130 is provided instead of precharge signal generation circuit 12, and an act signal generation circuit 120 is provided instead of act signal generation circuit 13.

In synchronous semiconductor memory device 6000, act signal generation circuit 120 allows transmission of active command information to a corresponding bank to be adjusted as described with reference to the fourth embodiment. Also, precharge signal generation circuit 130 allows adjustment of transmission of precharge command information to a corresponding bank as described with reference to FIG. 5.

As a result, synchronous semiconductor memory device 6000 of the sixth embodiment allows activation of a bank to be delayed than the actual input time point of act command ACT, and inactivation of a bank to be delayed than the actual input time point of precharge command PRE. Thus, testing can be applied on a memory that carries out high speed operation using a tester that can supply only a low speed clock signal.

Seventh Embodiment

A synchronous semiconductor memory device 7000 according to a seventh embodiment of the present invention allows generation of an internal clock signal of high frequency according to an external signal in addition to an external clock signal in a test mode.

An example of the entire structure of synchronous semiconductor memory device 7000 according to the seventh embodiment will be described with reference to FIG. 25.

Figure 25:
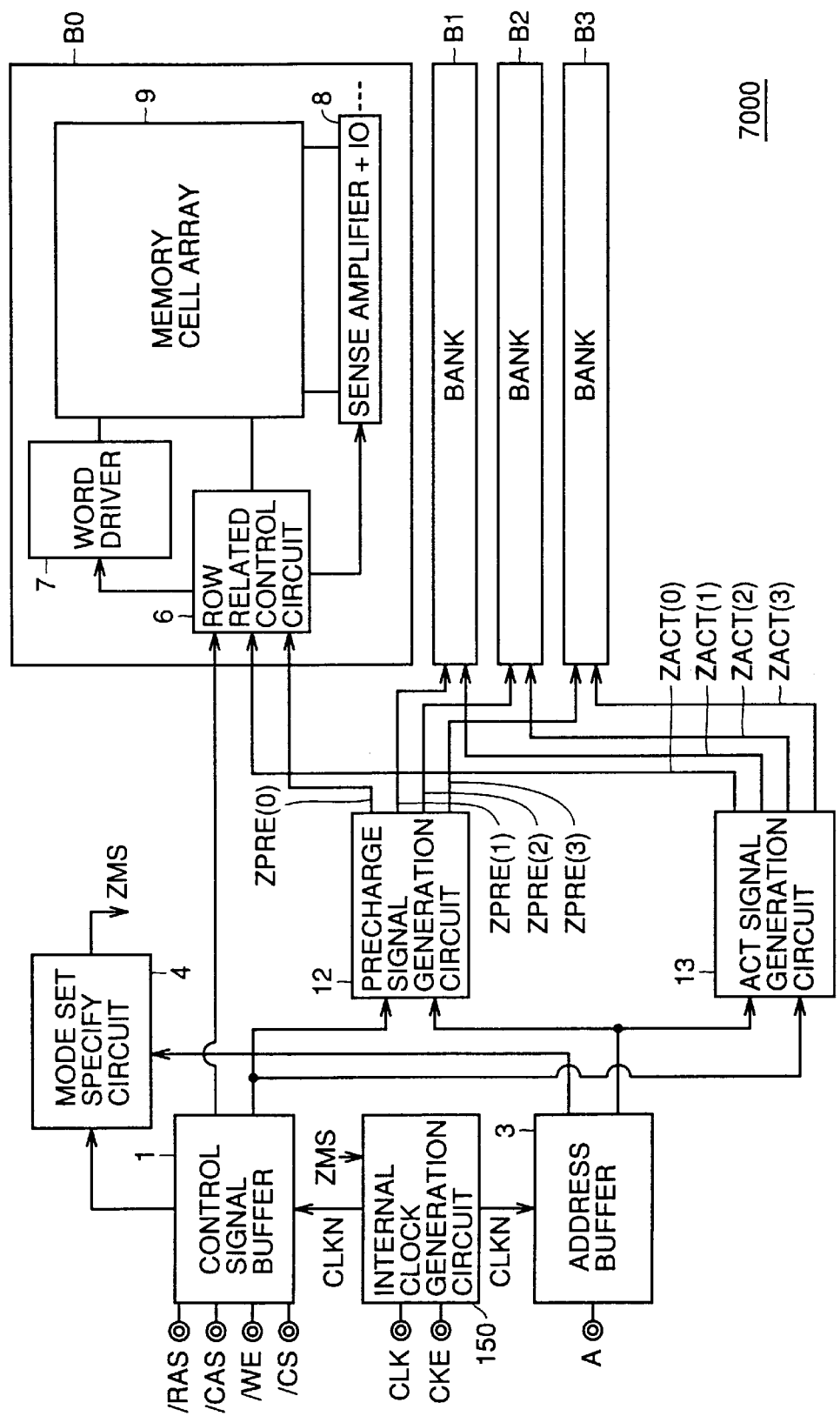
FIG. 25 is a schematic block diagram showing an example of an entire structure of a synchronous semiconductor memory device 7000 according to a seventh embodiment of the present invention.

In FIG. 25, elements corresponding to those of conventional synchronous semiconductor memory device 9000 have the same reference characters allotted, and their description will not be repeated.

Synchronous semiconductor memory device 7000 of FIG. 25 differs from conventional synchronous semiconductor memory device 9000 in that an internal clock signal 150 is provided instead of internal clock generation circuit 2. Internal clock generation circuit 150 outputs an internal clock signal CLKN having a frequency which is a multiple of the frequency of a conventional internal clock signal.

It is assumed that mode set specify circuit 4 responds to an external signal for detecting whether a particular test mode is specified or not to output a test mode signal ZMS.

Internal clock generation circuit 150 responds to test mode signal ZMS to generate and output an internal clock signal CLKN having a frequency higher than the frequency of a normal internal clock signal (referred to as CLK1 hereinafter for the sake of simplification).

An example of a specific structure of internal clock generation circuit 150 of the seventh embodiment will be described with reference to FIG. 26.

Figure 26:
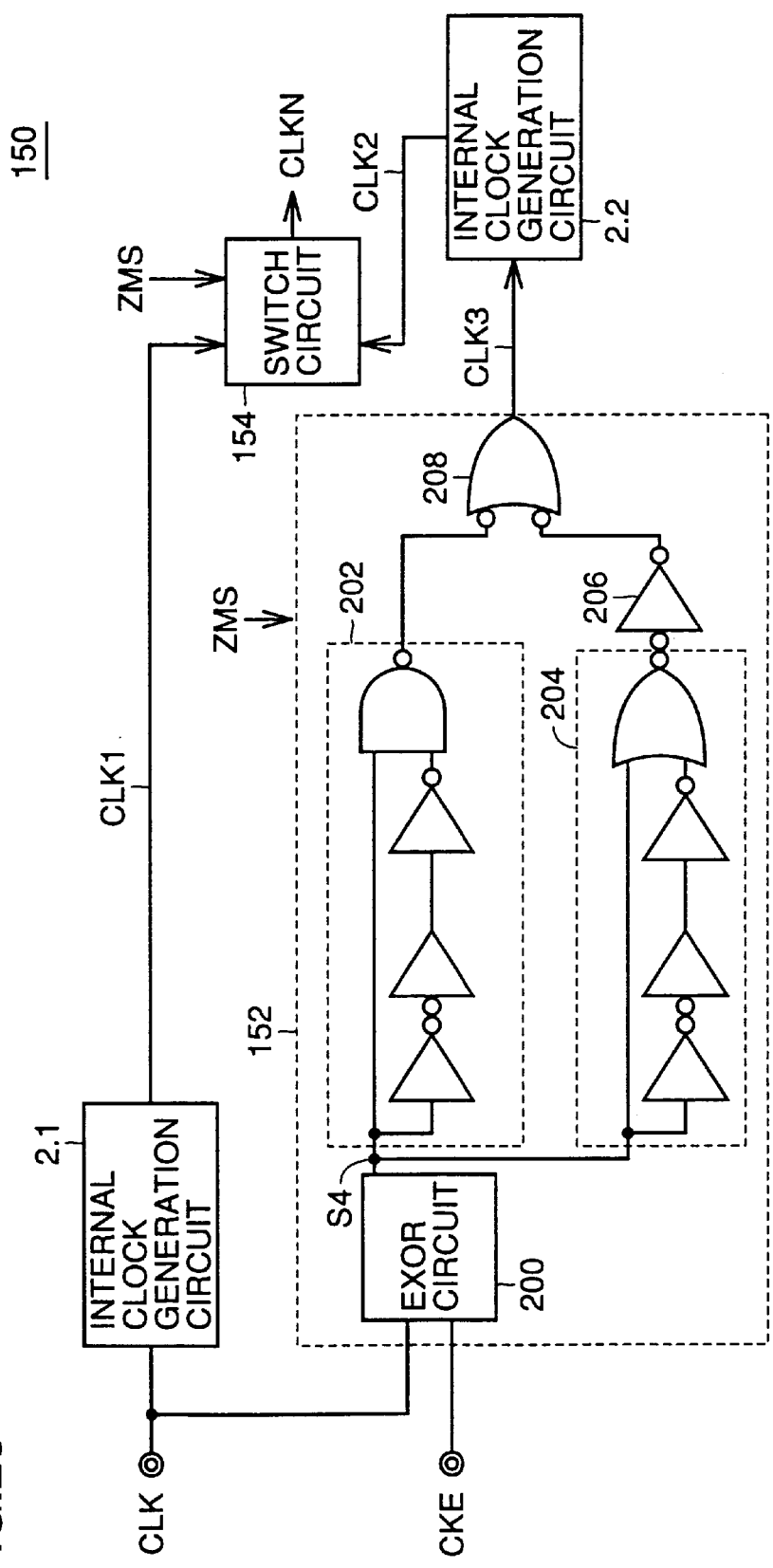
FIG. 26 is a circuit diagram showing an example of a specific structure of an internal clock signal generation circuit 150 of the seventh embodiment.
Figure 27:
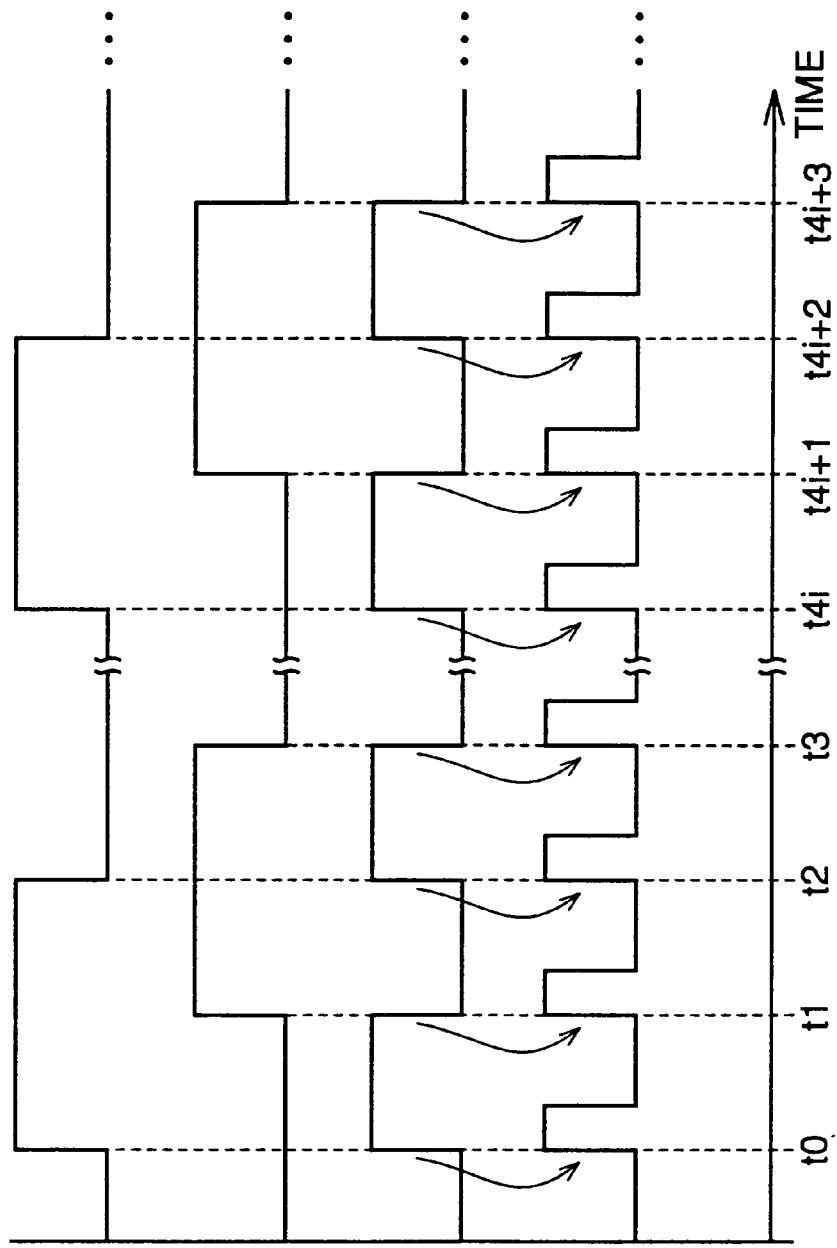
FIGS. 27A–27D are timing charts for describing an operation of internal clock generation circuit 150 of the seventh embodiment.

Referring to FIG. 26, internal clock generation circuit 150 includes internal clock generation circuits 2.1 and 2.2, a test mode clock generation circuit 152, and a switch circuit 154. Internal clock generation circuits 2.1 and 2.2 have a structure similar to that of conventional internal clock generation circuit 2. A clock signal synchronizing in phase with an input clock signal (or synchronizing in phase and in frequency) is output.

Test mode clock generation circuit 152 responds to test mode signal ZMS to output a clock signal CLK3 according to external clock signal CLK and an external clock enable signal CKE which is one external control signal. Internal clock generation circuit 2.1 receives external signal CLK to output an internal clock signal CLK1. Internal clock generation circuit 2.2 receives clock signal CLK3 to output an internal clock signal CLK2.

Switch circuit 154 responds to test mode signal ZMS to output either internal clock signal CLK1 or CLK2 as internal clock signal CLKN. Synchronous semiconductor memory device 7000 operates according to this internal clock signal CLKN.

A specific structure of test mode generation circuit 152 will be described hereinafter. Test mode clock generation circuit 152 includes an EXOR circuit 200, one shot pulse generation circuits 202 and 204, an inverter circuit 206, and a logic gate 208.

EXOR circuit 200 takes an exclusive OR of external clock signal CLK and external clock enable signal CKE. One shot pulse generation circuit 202 generates a one shot pulse of an L level at a rise of signal S4 output from EXOR circuit 200. One shot pulse generation circuit 204 generates a one shot pulse of an H level at a fall of output signal S4 of EXOR circuit 200 to an L level.

Inverter circuit 206 inverts the output of one shot pulse generation circuit 204 for output. Logic gate 208 receives the output signals of one shot pulse generation circuit 202 and inverter circuit 206 to generate a clock signal CLK3.

An operation of internal clock generation circuit 150 in a test mode will be described hereinafter with reference to the timing charts of FIGS. 27A–27D.

FIGS. 27A, 27B, 27C and 27D show external clock signal CLK, external clock enable signal CKE, output signal S4 of EXOR circuit 200, and internal clock signal CLKN, respectively. It is assumed that the device in a test mode (for example, test mode signal ZMS is in an active state of an L level).

External clock signal CLK is pulled up to an H level from an L level at time ti×4 (i is an integer of 0 and above), and is pulled down from an H level to an L level at time ti×4+2. In contrast, external clock enable signal CKE is pulled up to an H level from an L level at time ti×4+1 (i is an integer of 0 and above), and is pulled down from an H level to an L level at time ti×4+3.

EXOR circuit 200 provides the difference in the timing of level transition of external clock signal CLK and external clock enable signal CKE. Therefore, the signal output from EXOR circuit 200 is driven to an H level from an L level and from an H level to an L level at time ti×2 and ti×2+1, respectively.

Accordingly, a pulse is generated from one shot pulse generation circuits 202 and 204 at time ti×2 and ti×2+1, respectively. In response, internal clock generation circuit 2.2 outputs an internal clock signal CLK2 having a frequency which is a multiple of the frequency of external clock signal CLK. Switch circuit 154 provides internal clock signal CLK2 as internal clock signal CLKN. In this case, the voltage of the pin where external clock enable signal CKE is input is internally set at a fixed potential.

By controlling the level transition timing of external clock enable signal CKE with respect to the level transition timing of external clock signal CLK in synchronous semiconductor memory device 7000, an internal clock signal CLKN having a frequency of a multiple of a conventional internal clock signal can be generated. As a result, the tRCD period and tRP period can be easily reduced.

Eighth Embodiment

A synchronous semiconductor memory device 8000 according to an eighth embodiment of the present invention allows adjustment of activation of a bank more directly according to an external signal in a test mode.

An example of an entire structure of synchronous semiconductor memory device 8000 according to the eighth embodiment will be described with reference to FIG. 28.

Figure 28:
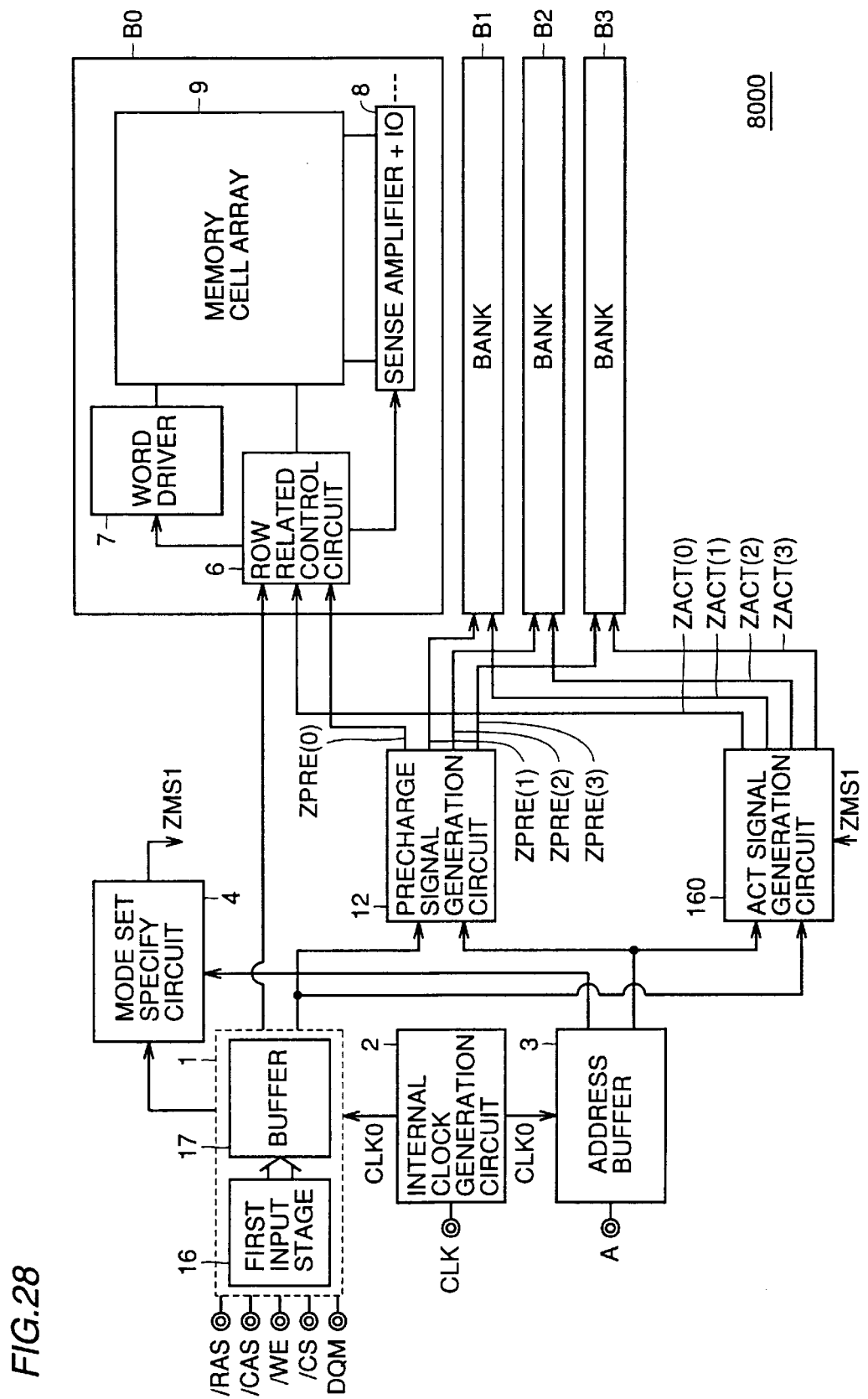
FIG. 28 is a schematic block diagram showing an example of an entire structure of a synchronous semiconductor memory device 8000 according to an eighth embodiment of the present invention.

In FIG. 28, elements corresponding to those of conventional synchronous semiconductor memory device 9000 have the same reference characters allotted, and their description will not be repeated.

Synchronous semiconductor memory device 8000 of FIG. 28 differs from conventional synchronous semiconductor memory device 9000 in that an act signal generation circuit 160 is provided instead of act signal generation circuit 13.

It is assumed that mode set specify circuit 4 responds to an external signal to detect whether a particular test mode is specified or not to output a test mode signal ZMS1.

Act signal generation circuit 160 outputs activation command information corresponding to an externally applied act command ACT in a delayed manner in a test mode. In a mode other than the test mode (normal mode), active command information is transmitted to a bank in response to act command ACT as in the conventional case.

An example of a specific structure of act signal generation circuit 160 of the eighth embodiment will be described with reference to FIG. 29.

Figure 29:
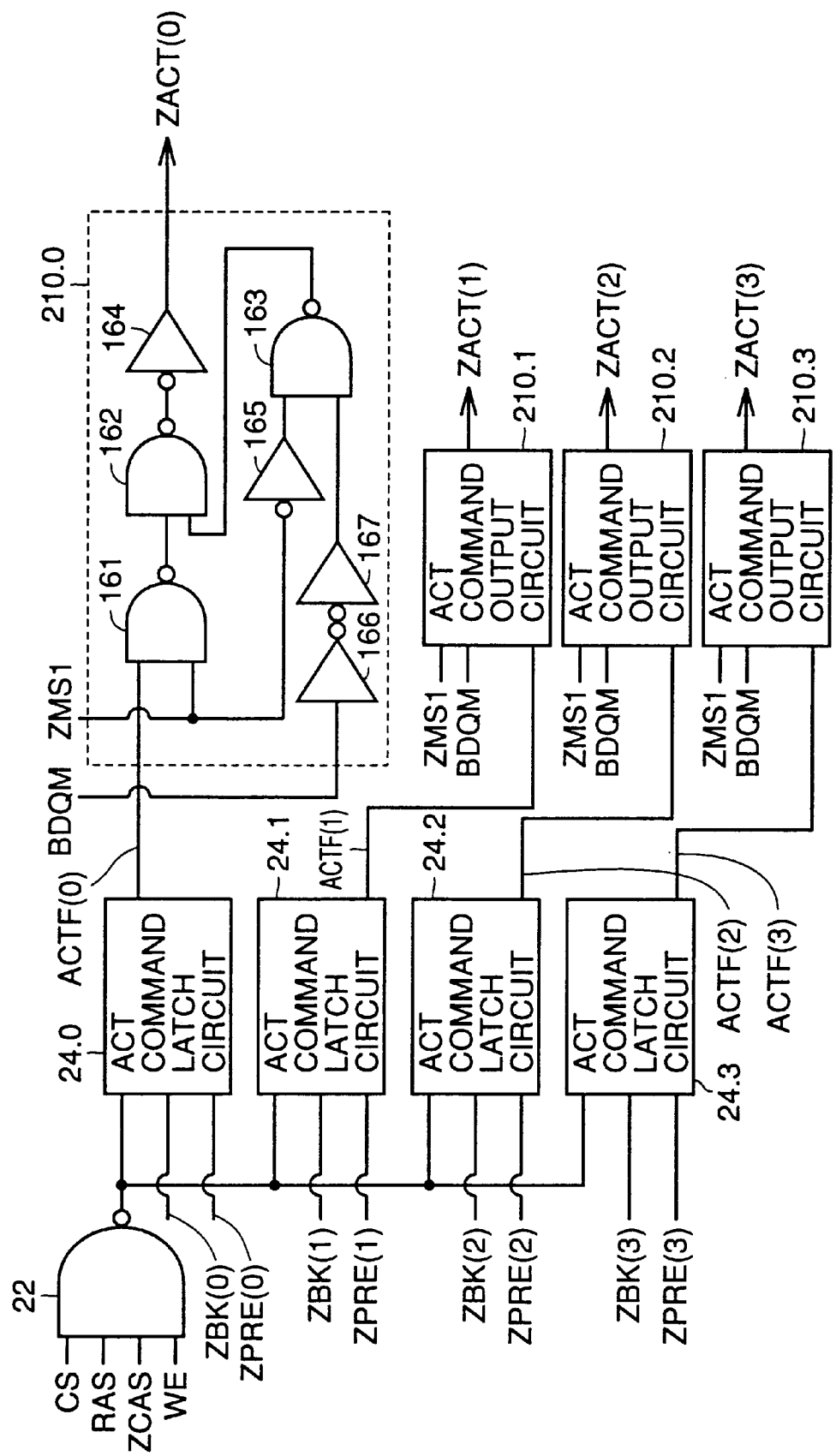
FIG. 29 is a circuit diagram showing an example of a specific structure of an act signal generation circuit 160 of the eighth embodiment.

Act signal generation circuit 160 of FIG. 29 includes a NAND circuit 22, act command latch circuits 24.0, 24.1, 24.2, and 24.3, and act command output circuits 210.0, 210.1, 210.2, and 210.3.

NAND circuit 22 and act command latch circuit 24 are as described in the first embodiment. Act command output circuits 210.0, 210.1, 210.2 and 210.3 (generically referred to as act command output circuit 210) are provided correspondingly to banks B0, B1, B2, and B3, respectively.

Act command output circuit 210 responds to test mode signal ZMS1 and a particular external signal (specifically, external control signal DQM) to output act initiation signal ZACT.

The structure of act command output circuit 210 will be described taking act command output circuit 210.0 as an example.

Act command output circuits 210.1, 210.2 and 210.3 respectively have a structure identical to that of act command output circuit 210.0.

Act command output circuit 210.0 includes NAND circuits 161, 162 and 163, and inverter circuits 164, 165, 166 and 167.

Inverter circuit 166 receives signal BDQM from first input stage 16 shown in FIG. 28 to invert the received signal for output.

Inverter circuit 167 receives the output signal of inverter circuit 166 at its input to invert the signal for output. NAND circuit 163 receives an inverted version of test mode signal ZMS1 via inverter circuit 165 at its first input node and an output signal of inverter circuit 167 at its second input node.

NAND circuit 161 receives a signal ACTF(0) held in a corresponding act command latch circuit 24.0 at its first input node, and test mode signal ZMS1 at its second input node. NAND circuit 162 receives an output signal of NAND circuit 161 at its first input node, and an output signal of NAND circuit 163 at its second input node. Inverter circuit 164 receives an output signal of NAND circuit 162. A corresponding act initiation signal ZACT is output from respective inverter circuits 164.

An operation of act signal generation circuit 160 in a test mode will be described hereinafter with reference to the timing charts of FIGS. 30A–30D.

FIGS. 30A, 30B, 30C and 30D show external control signal /RAS, external control signal /CAS, external control signal DQM, and act initiation signal ZACT(0), respectively. It is assumed that test mode signal ZMA1 is in an active state of an L level (test mode).

Figure 30:
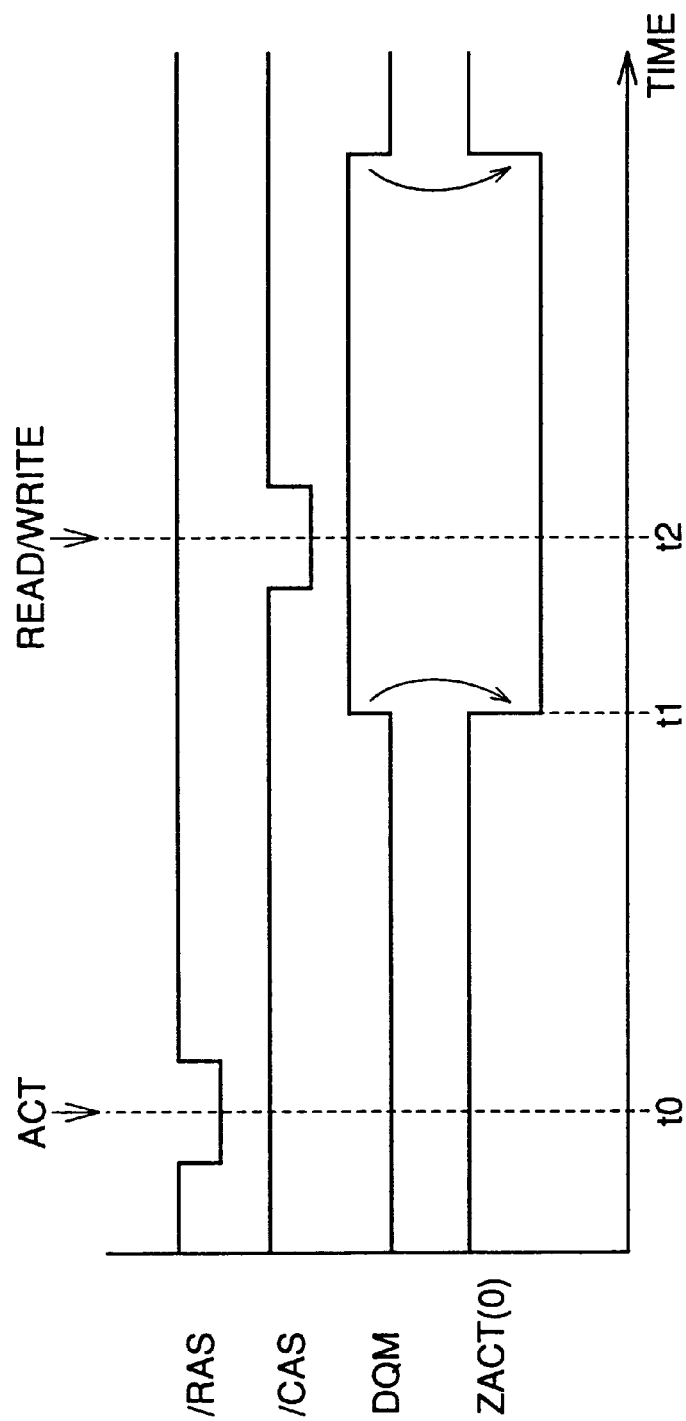
FIGS. 30A–30D are timing charts for describing an operation of act signal generation circuit 160 of the eighth embodiment.
Figure 31:
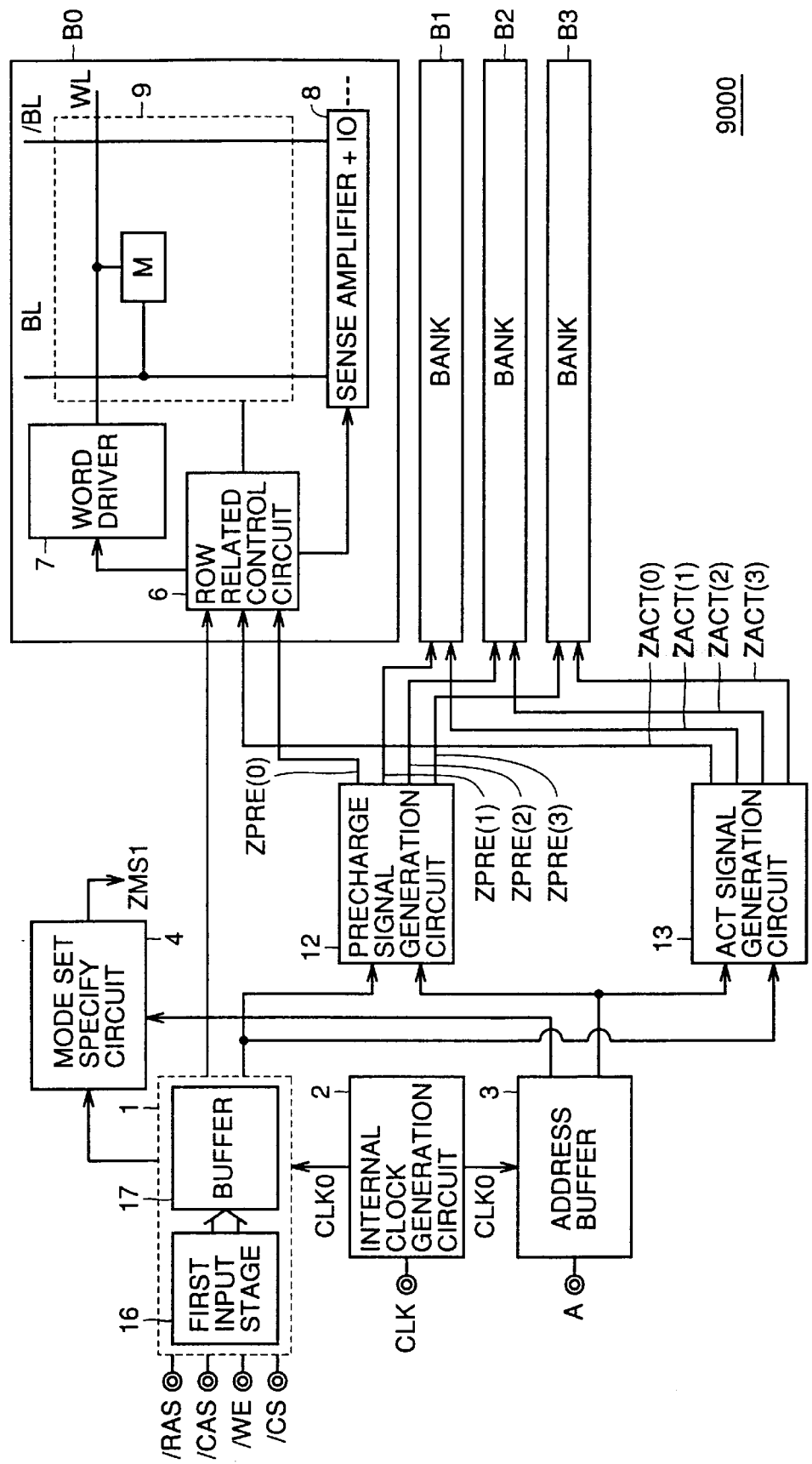
FIG. 31 is a schematic block diagram showing a structure of main components of a conventional synchronous semiconductor memory device 9000.
Figures 32A, 32B, 32C, 32D, 32E, 32F:
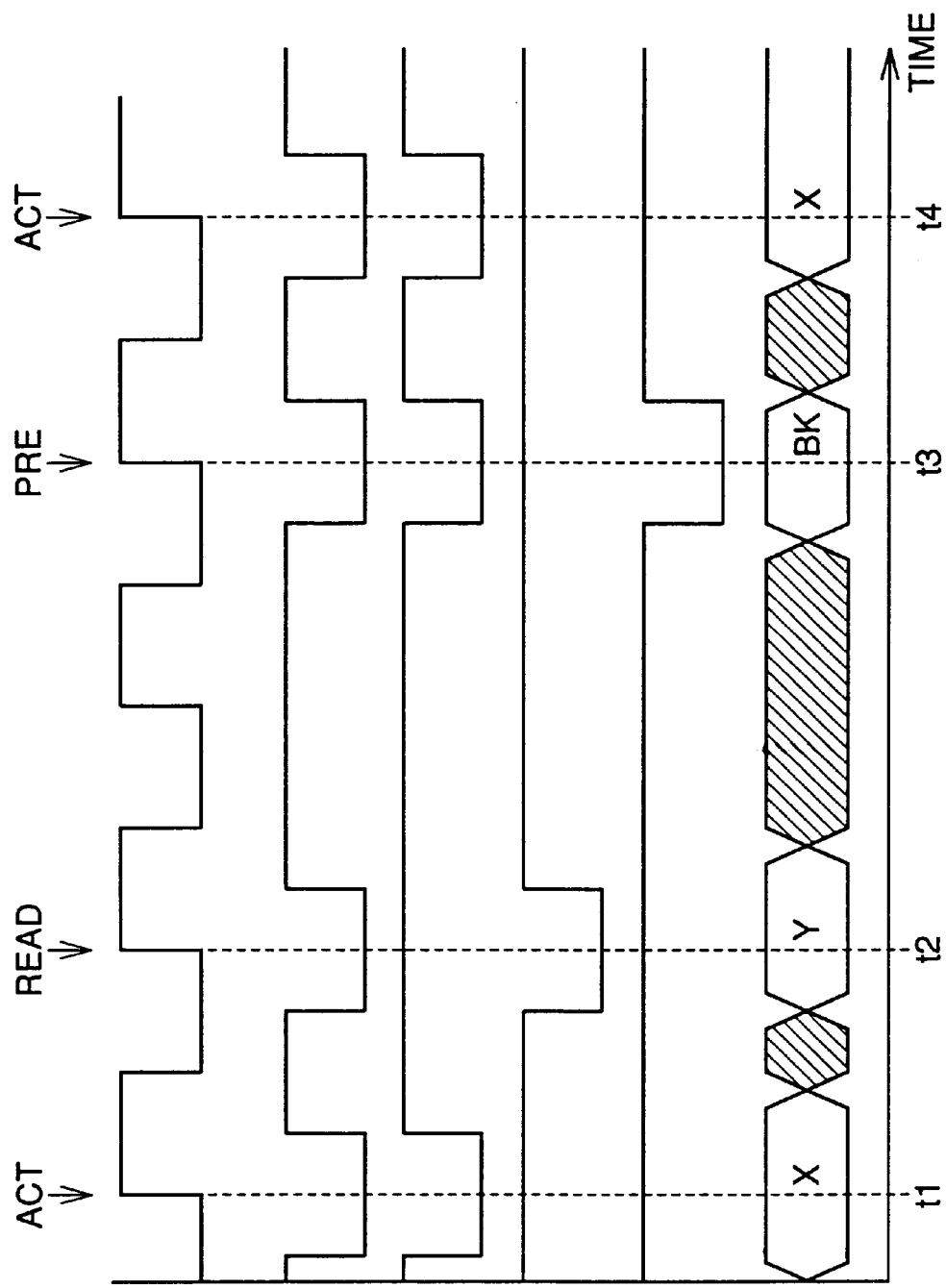
FIGS. 32A–32F are timing charts for describing an example of an operation of conventional synchronous semiconductor memory device 9000 of FIG. 31.

Since external control signal DQM is at an L level at the time point of input of act command ACT (time t0) shown in FIG. 30, act initiation signal ZACT(0) is not output.

Then, in response to external control (external control signal DQM driven to an H level from an L level), signal BDQM is set at an H level. As a result, act initiation signal ZACT(0) attains an active state of an L level at time t1.

Thus, activation of bank B0 is initiated lagging behind the actual input of act command ACT.

When a read or write command (READ/WRITE) is input at the input timing of the next external clock signal (time t2), the duration between time t1 and time t2 becomes the tRCD period. In this case, the internal control signal with respect to external control signal DQM is fixed at an L level to prevent application of a read (write) mask.

In a normal mode, a bank initiation signal ZACT is output to respective banks according to the input timing of an externally applied act command ACT.

In the synchronous semiconductor memory device of the eighth embodiment, a bank can be rendered active lagging behind the input time point of act command ACT in a more direct manner. As a result, the tRCD period becomes shorter than the conventional tRCD period. Therefore, testing can be applied on a memory that operates at high speed using a tester that can supply only a low speed clock signal.

Although adjustment of the timing of transmitting active command information was described above, the present invention is applicable to the adjustment of the timing of transmitting precharge command information.

Also, the present invention is not limited to the above-described embodiment where transmission of an act initiation signal to a corresponding row related control circuit is effected using external control signal DQM. A similar object can be achieved using other external signals.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A synchronous semiconductor memory device comprising:
    a plurality of banks, each bank including a memory cell array having a plurality of memory cells arranged in a matrix of rows and columns and a plurality of word lines provided corresponding to said rows of said memory cell array;
    internal clock generation means for providing an internal clock signal in synchronization with an external clock signal;
    test mode detection means responsive to an externally applied test mode specify signal for detecting specification of a particular test mode to output a test mode signal as a detected result; and
    active control means for detecting an active command of activating said word line that is applied in synchronization with said internal clock signal to output an active initiation signal to render said word line active, said active control means responding to said test mode signal to delay said active initiation signal than an input timing of said active command and providing said delayed active initiation signal to said bank.

2. The synchronous semiconductor memory device according to claim 1, wherein said active control means comprises
    latch means for generating and latching said active initiation signal corresponding to said active command,
    control means responsive to said test mode signal for providing an enable signal according to timing of level transition of an externally applied external signal, and
    output means responsive to said enable signal for providing a corresponding active initiation signal to said bank according to an output of said latch means.

3. The synchronous semiconductor memory device according to claim 1, wherein said active control means comprises
    first output means for generating and providing said active initiation signal corresponding to said active command,
    second output means responsive to said test mode signal for delaying and providing said active initiation signal output from said first output means, and
    control means responsive to said test mode signal for providing one of an output of said first output means and an output of said second output means as said active initiation signal.

4. The synchronous semiconductor memory device according to claim 1, wherein said active control means comprises output means responsive to said test mode signal for providing an externally applied external signal as said active initiation signal corresponding to said active command.

5. The synchronous semiconductor memory device according to claim 3, wherein said second output means comprises
    latch means responsive to said test mode signal for latching and providing an output of said first output means at a fall timing of said internal clock signal that determined a received timing of said active command, and
    delay means for delaying an output of said latch means.

6. A synchronous semiconductor memory device comprising:
    a plurality of banks, each bank including a memory cell array having a plurality of memory cells arranged in a matrix of rows and columns and a plurality of word lines provided corresponding to said rows of said memory cell array;
    internal clock generation means for providing an internal clock signal in synchronization with an external clock signal;
    test mode detection means responsive to an externally applied test mode specify signal for detecting specification of a particular test mode to output a test mode signal as a detected result; and
    inactive control means for detecting an inactive command of inactivating said word line that is applied in synchronization with said internal clock signal for providing an inactive initiation signal that renders said word line inactive, said inactive control means responding to said test mode signal for delaying said inactive initiation signal than an input timing of said inactive command for providing said delayed inactive initiation signal to said bank.

7. The synchronous semiconductor memory device according to claim 6, wherein said inactive control means comprises
    latch means for generating and latching said inactive initiation signal corresponding to said inactive command,
    control means responsive to said test mode signal for providing an enable signal according to timing of level transition of an externally applied external signal, and
    output means responsive to said enable signal for providing a corresponding inactive initiation signal to said bank according to an output of said latch means.

8. The synchronous semiconductor memory device according to claim 6, wherein said inactive control means comprises
    first output means for generating and providing said inactive initiation signal corresponding to said inactive command,
    second output means responsive to said test mode signal for delaying and providing said inactive initiation signal output from said first output means, and
    control means responsive to said test mode signal for providing one of an output of said first output means and an output of said second output means as said inactive initiation signal.

9. The synchronous semiconductor memory device according to claim 6, wherein said inactive control means comprises output means responsive to said test mode signal for providing an externally applied external signal as said inactive initiation signal corresponding to said inactive command.

10. The synchronous semiconductor memory device according to claim 8, wherein said second output means comprises latch means responsive to said test mode signal for latching and providing an output of said first output means at a fall timing of said internal clock signal that determined a receive timing of said inactive command, and delay means for delaying an output of said latch means.

11. A synchronous semiconductor memory device comprising:

a plurality of banks, each bank including a memory cell array having a plurality of memory cells arranged in a matrix of rows and columns and a plurality of word lines provided corresponding to said rows of said memory cell array;

internal clock generation means for providing an internal clock signal in synchronization with an external clock signal;

test mode detection means responsive to an externally applied test mode specify signal for detecting specification of a particular test mode to output a test mode signal as a detected result;

active control means for detecting an active command of activating said word line that is input in synchronization with said internal clock signal to output an active initiation signal for rendering said word line active, said active control means responding to said test mode signal to delay said active initiation signal than an input timing of said active command and providing the delayed signal to a corresponding bank; and inactive control means for detecting an inactive command of inactivating said word line that is input in synchronization with said internal clock signal to provide an inactive initiation signal for rendering said word line inactive, said inactive control means responding to said test mode signal to delay said inactive initiation signal than an input timing of said inactive command and providing the delayed signal to a corresponding bank.

12. The synchronous semiconductor memory device according to claim 11, wherein said active control means comprises first latch means for generating and latching said active initiation signal corresponding to said active command, first control means responsive to said test mode signal for providing a first enable signal according to timing of level transition of an externally applied first external signal, and first output means responsive to said first enable signal for providing a corresponding active initiation signal to said bank according to an output of said first latch means, wherein said inactive control means comprises second latch means for generating and latching said inactive initiation signal corresponding to said inactive command, second control means responsive to said test mode signal for providing a second enable signal according to timing of level transition of an externally applied second external signal, and second output means responsive to said second enable signal for providing a corresponding inactive initiation signal to said bank according to an output of said second latch means.

13. The synchronous semiconductor memory device according to claim 11, wherein said active control means comprises first output means for generating and providing said active initiation signal corresponding to said active command, second output means responsive to said test mode signal for delaying and providing said active initiation signal output from said first output means, and first control means responsive to said test mode signal for providing one of an output of said first output means and an output of said second output means as said active initiation signal, wherein said inactive control means comprises third output means for generating and providing said inactive initiation signal corresponding to said inactive command, fourth output means responsive to said test mode signal for delaying and providing said inactive initiation signal output from said third output means, and second control means responsive to said test mode signal for providing one of an output of said third output means and an output of said fourth output means as said inactive initiation signal.

14. The synchronous semiconductor memory device according to claim 11, wherein said active control means comprises first output means responsive to said test mode signal for providing an externally applied first external signal as said active initiation signal corresponding to said active command, and wherein said inactive control means comprises second output means responsive to said test mode signal for providing an externally applied second external signal as said inactive initiation signal corresponding to said inactive command.

15. The synchronous semiconductor memory device according to claim 13, wherein said second output means comprises first latch means responsive to said test mode signal for latching and providing an output of said first output means at a fall timing of said internal clock signal that determined a receive timing of said active command, and first delay means for delaying an output of said first latch means, wherein said fourth output means comprises second latch means responsive to said test mode signal for latching and providing an output of said third output means at a fall timing of said internal clock signal that determined a receive timing of said inactive command; and second delay means for delaying an output of said second latch means.

* * * * *